(12) United States Patent
Yamazaki et al.

(10) Patent No.: US 8,030,147 B2
(45) Date of Patent: Oct. 4, 2011

(54) METHOD FOR MANUFACTURING THIN FILM TRANSISTOR AND DISPLAY DEVICE INCLUDING THE THIN FILM TRANSISTOR

(75) Inventors: Shunpei Yamazaki, Setagaya (JP); Yasuhiro Jinbo, Atsugi (JP); Makoto Furuno, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 421 days.

(21) Appl. No.: 12/208,867

(22) Filed: Sep. 11, 2008

(65) Prior Publication Data

US 2009/0072237 A1    Mar. 19, 2009

(30) Foreign Application Priority Data

Sep. 14, 2007    (JP) .................. 2007-240201

(51) Int. Cl.
*H01L 21/00* (2006.01)
(52) U.S. Cl. .................. 438/164; 438/151; 438/166
(58) Field of Classification Search .................. 438/151, 438/164, 166
See application file for complete search history.

(56) References Cited

U.S. PATENT DOCUMENTS

| | | | |
|---|---|---|---|
| 4,409,134 A | 10/1983 | Yamazaki | |
| RE34,658 E | 7/1994 | Yamazaki et al. | |
| 5,453,858 A | 9/1995 | Yamazaki | |
| 5,514,879 A | 5/1996 | Yamazaki | |
| 5,614,732 A | 3/1997 | Yamazaki | |
| 5,701,167 A | 12/1997 | Yamazaki | |
| 5,766,989 A * | 6/1998 | Maegawa et al. | 438/166 |
| 5,843,225 A | 12/1998 | Takayama et al. | |
| 5,849,601 A | 12/1998 | Yamazaki | |
| 5,859,445 A | 1/1999 | Yamazaki | |
| 5,932,302 A | 8/1999 | Yamazaki et al. | |
| 6,011,277 A | 1/2000 | Yamazaki | |
| 6,023,075 A | 2/2000 | Yamazaki | |
| 6,171,674 B1 | 1/2001 | Yamazaki et al. | |
| 6,183,816 B1 | 2/2001 | Yamazaki et al. | |

(Continued)

FOREIGN PATENT DOCUMENTS

EP    1 505 174    2/2005

(Continued)

OTHER PUBLICATIONS

Arai et al., "41.2: Micro Silicon Technology for Active Matrix OLED Display," SID Digest '07: SID International Symposium Digest of Technical Papers, 2007, pp. 1370-1373.

(Continued)

*Primary Examiner* — Zandra Smith
*Assistant Examiner* — Christy Novacek
(74) *Attorney, Agent, or Firm* — Eric J. Robinson; Robinson Intellectual Property Law Office, P.C.

(57) ABSTRACT

To provide a method for manufacturing a thin film transistor with excellent electric characteristics and high reliability and a display device including the thin film transistor. A gate insulating film is formed over a gate electrode, crystal nuclei is formed over the gate insulating film using fluorosilane and silane, and crystal growth is generated using the crystal nuclei as nuclei to form a microcrystalline semiconductor film, so that crystallinity at an interface between the gate insulating film and the microcrystalline semiconductor film is improved. Next, a thin film transistor is manufactured using the microcrystalline semiconductor film having crystallinity improved at the interface between the gate insulating film and the microcrystalline semiconductor film as a channel formation region.

30 Claims, 24 Drawing Sheets

U.S. PATENT DOCUMENTS

| | | | |
|---|---|---|---|
| 6,218,702 | B1 | 4/2001 | Yamazaki et al. |
| 6,252,249 | B1 | 6/2001 | Yamazaki |
| 6,281,520 | B1 | 8/2001 | Yamazaki |
| 6,306,213 | B1 | 10/2001 | Yamazaki |
| 6,468,617 | B1 | 10/2002 | Yamazaki et al. |
| 6,589,822 | B1 | 7/2003 | Yamazaki et al. |
| 6,610,142 | B1 | 8/2003 | Takayama et al. |
| 6,737,676 | B2 | 5/2004 | Yamazaki |
| 6,835,523 | B1 | 12/2004 | Yamazaki et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 2005/0022864 | A1 | 2/2005 | Fujioka et al. |
| 2005/0089648 | A1 | 4/2005 | Yamazaki et al. |
| 2006/0238132 | A1 | 10/2006 | Kitamura et al. |
| 2006/0240602 | A1* | 10/2006 | Roca I Cabarrocas et al. .............. 438/149 |
| 2007/0018165 | A1 | 1/2007 | Yamazaki |
| 2008/0308807 | A1 | 12/2008 | Yamazaki et al. |
| 2009/0023236 | A1 | 1/2009 | Miyairi et al. |

FOREIGN PATENT DOCUMENTS

| | | |
|---|---|---|
| JP | 62-062073 | 12/1987 |
| JP | 02-053941 | 11/1990 |
| JP | 04-242724 | 8/1992 |
| JP | 11-121761 | 4/1999 |
| JP | 2000-277439 | 10/2000 |
| JP | 2004-014958 | 1/2004 |
| JP | 2005-049832 | 2/2005 |
| JP | 2005-050905 | 2/2005 |
| JP | 2005-167051 | 6/2005 |
| JP | 2007-005705 | 1/2007 |
| JP | 2007-048982 | 2/2007 |

OTHER PUBLICATIONS

Sazonov et al., "Low-Temperature Materials and Thin Film Transistors for Flexible Electronics," Proceedings of the IEEE, Aug. 2005, vol. 93, No. 8, pp. 1420-1428.

Lee, et al., "Top-Gate TFTs Using 13.56MHz PECVD Microcrystalline Silicon," IEEE Electron Device Letters, vol. 26, No. 9, Sep. 2005, pp. 637-639.

Lee, et al., "Postdeposition Thermal Annealing and Material Stability of 75° C Hydrogenated Nanocrystalline Silicon Plasma-Enhanced Chemical Vapor Deposition Films," Journal of Applied Physics, 2005, vol. 98, pp. 034305-1-034305-7.

Esmaeili-Rad, et al., "Stability of Nanocrystalline Silicon Bottom-Gate Thin Film Transistors with Silicon Nitride Gate Dielectric," Journal of Applied Physics, 2007, vol. 102, pp. 064512-1-064512-7.

Esmaeili-Rad, et al., "Absence of Defect State Creation in Nanocrystalline Silicon Thin Film Transistors Deduced from Constant Current Stress Measurements," Applied Physics Letters, 2007, vol. 91, pp. 113511-1-113511-3.

Lee, et al., "Leakage Current Mechanisms in Top-Gate Nanocrystalline Silicon Thin Film Transistors," Applied Physics Letters, 2008, vol. 92, pp. 083509-1-083509-3.

Lee, et al., "Stability of nc-Si:H TFTs with Silicon Nitride Gate Dielectric," IEEE Transactions on Electron Devices, Jan. 2007, vol. 54, No. 1, pp. 45-51.

* cited by examiner

PRIOR ART

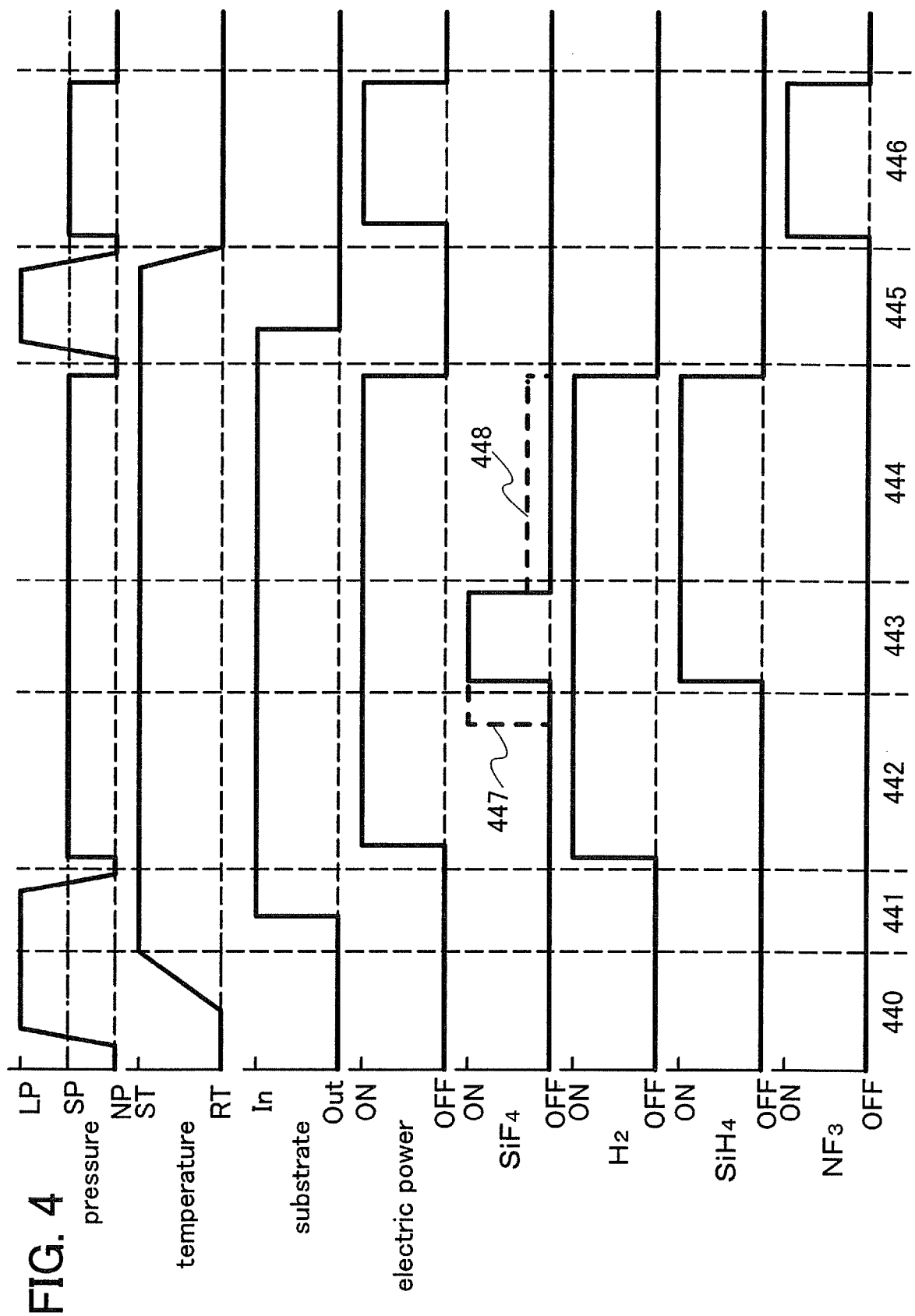

FIG. 8

FIG. 13A
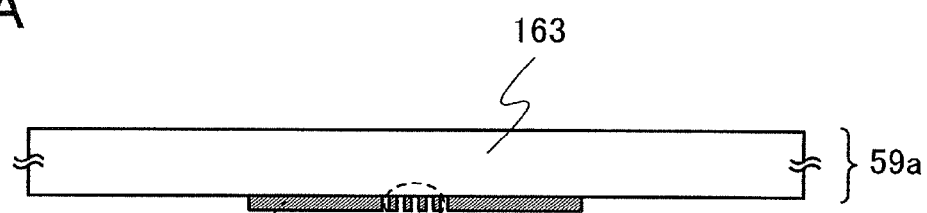
FIG. 13B
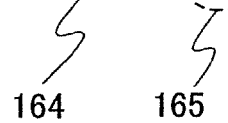
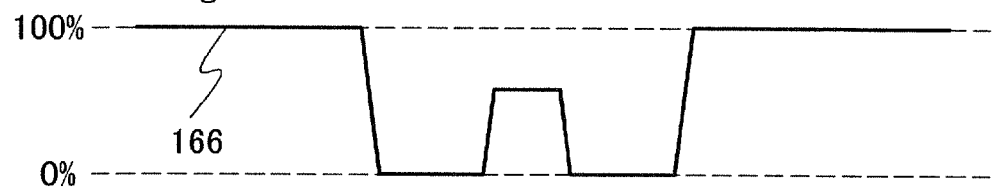
FIG. 13C
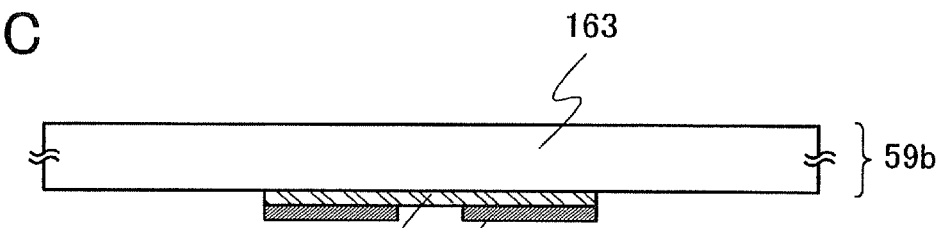
FIG. 13D
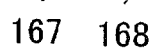
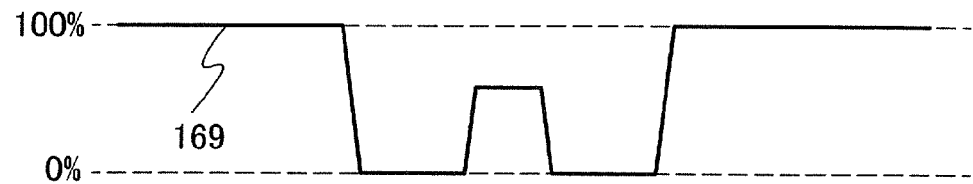

METHOD FOR MANUFACTURING THIN FILM TRANSISTOR AND DISPLAY DEVICE INCLUDING THE THIN FILM TRANSISTOR

BACKGROUND OF THE INVENTION

1. Field of the Invention

The present invention relates to a method for manufacturing a thin film transistor and a method for manufacturing a display device including the thin film transistor at least in a pixel portion.

2. Description of the Related Art

In recent years, techniques to form thin film transistors using, for a channel formation region, a semiconductor thin film (with a thickness of approximately several tens to several hundreds of nanometers) which is formed over a substrate having an insulating surface have attracted attention. The thin film transistor is widely applied to electronic devices such as ICs and an electro-optical device. Rapid development of a thin film transistor particularly as a switching element of an image display device is required.

As a switching element in an image display device, a thin film transistor in which an amorphous semiconductor film is used for a channel formation region, a thin film transistor in which a polycrystalline semiconductor film is used for a channel formation region, or the like is used. As a method of forming a polycrystalline semiconductor film, there is known a technique in which a pulsed excimer laser beam is shaped into a linear laser beam by an optical system and an amorphous silicon film is crystallized by being irradiated while being scanned with the linear laser beam.

As a switching element in an image display device, further, a thin film transistor in which a microcrystalline semiconductor film is used for a channel formation region is used (see Reference 1: Japanese Published Patent Application No. H4-242724; and Reference 2 : Japanese Published Patent Application No. 2005-49832).

A thin film transistor in which a polycrystalline semiconductor film is used for a channel formation region has an advantage that the mobility is higher than that of a thin film transistor in which an amorphous semiconductor film is used for a channel formation region by two or more digits, and a pixel portion and a peripheral driver circuit of a semiconductor display device can be formed over the same substrate. However, the thin film transistor in which a polycrystalline semiconductor film is used for a channel formation region requires a more complicated process than the thin film transistor in which an amorphous semiconductor film is used for a channel formation region because of crystallization of the semiconductor film. Thus, there are problems such as a reduction in yield and an increase in cost.

Further, an inversely-staggered thin film transistor in which a microcrystalline semiconductor film is used for a channel formation region has problems in that the crystallinity of an interface region between a gate insulating film and the microcrystalline semiconductor film is low and electric characteristics of the thin film transistor are poor.

In view of the above problems, it is an object of the present invention to provide a method for manufacturing a thin film transistor with excellent electric characteristics and high reliability and a display device including the thin film transistor with high yield.

SUMMARY OF THE INVENTION

A gate insulating film is formed over a gate electrode, crystal nuclei are formed on the gate insulating film using fluorine or a fluoride of hydrogen, silicon, germanium, or the like and a gas which is deposited containing silicon or germanium, crystal growth is generated using the crystal nuclei as nuclei with the use of the gas which is deposited, including silicon or germanium to form a microcrystalline semiconductor film, and the crystallinity at an interface between the gate insulating film and the microcrystalline semiconductor film is improved. Next, a thin film transistor is formed using the microcrystalline semiconductor film whose crystallinity at the interface between the gate insulating film and the microcrystalline semiconductor film is improved as a channel formation region.

Further, a buffer layer is formed successively over the microcrystalline semiconductor film whose crystallinity at the interface between the gate insulating film and the microcrystalline semiconductor film is improved, and a source region and a drain region, and a source wiring and a drain wiring are formed over the buffer layer; thus, a thin film transistor is formed.

A display device is manufactured by forming a pixel electrode connected to the thin film transistor.

As a fluoride of hydrogen, silicon, germanium, or the like, HF, $SiF_4$, $SiHF_3$, $SiH_2F_2$, $SiH_3F$, $Si_2F_6$, $GeF_4$, $GeHF_3$, $GeH_2F_2$, $GeH_3F$, $Ge_2F_6$, or the lie can be given. As a gas which is deposited, including silicon or germanium, $SiH_4$, $Si_2H_6$, $GeH_4$, $Ge_2H_6$, or the like can be given.

Further, thin film transistors (TFTs) are manufactured using the microcrystalline semiconductor films for channel formation regions, and a display device is manufactured using the thin film transistors for a pixel portion and further for a driver circuit. The thin film transistor in which the microcrystalline semiconductor film is used for the channel formation region has a mobility of 1 $cm^2$/V·sec to 20 $cm^2$/V·sec, which is 2 times to 20 times higher than that of a thin film transistor in which an amorphous semiconductor film is used for a channel formation region. Therefore, part of a driver circuit or the entire driver circuit can be formed over the same substrate as a pixel portion, so that a system-on-panel can be manufactured.

Examples of the display device include a light-emitting device and a liquid crystal display device. The light-emitting device includes a light-emitting element, and the liquid crystal display device includes a liquid crystal element. A light-emitting element includes, in its category, an element whose luminance is controlled by a current or a voltage, and specifically includes organic electroluminescence (EL) and inorganic electroluminescence (EL).

In addition, the display device includes a panel in which a display element is sealed, and a module in which an IC and the like including a controller are mounted on the panel. The present invention further relates to one mode of an element substrate before the display element is completed in a manufacturing process of the display device, and the element substrate is provided with a means for supplying current to the display element in each of a plurality of pixels. An element substrate may be specifically in a state where only a pixel electrode of a display element is formed or in a state after a conductive film to be a pixel electrode is formed and before the conductive film is etched into a pixel electrode, and any mode is possible.

Note that a display device in this specification means an image display device, a light-emitting device, or a light source (including a lighting device). Further, the display device includes any of the following modules in its category: a module including a connector such as an flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

According to the present invention, it is possible to manufacture a thin film transistor with excellent electric characteristics and high reliability and a display device including the thin film transistor.

By formation of the channel formation region using a microcrystalline semiconductor film, variation of the threshold voltage is suppressed, field-effect mobility is improved, and a subthreshold swing (S value) is made to be small, so that higher performance of the thin film transistor can be achieved. Thus, a driving frequency of a driver circuit of the display device can be increased, so that the panel sizes and density of pixels can be sufficiently increased.

BRIEF DESCRIPTION OF THE DRAWINGS

In the accompanying drawings:

FIG. 4 illustrates an example of a time chart illustrating a process for forming a microcrystalline silicon film;

FIG. 8 is a diagram illustrating a structure of a plasma CVD apparatus which can be applied to the present invention;

FIGS. 13A to 13D are diagrams illustrating multi-tone masks which can be applied to the present invention;

DETAILED DESCRIPTION OF THE INVENTION

Figure 1A:
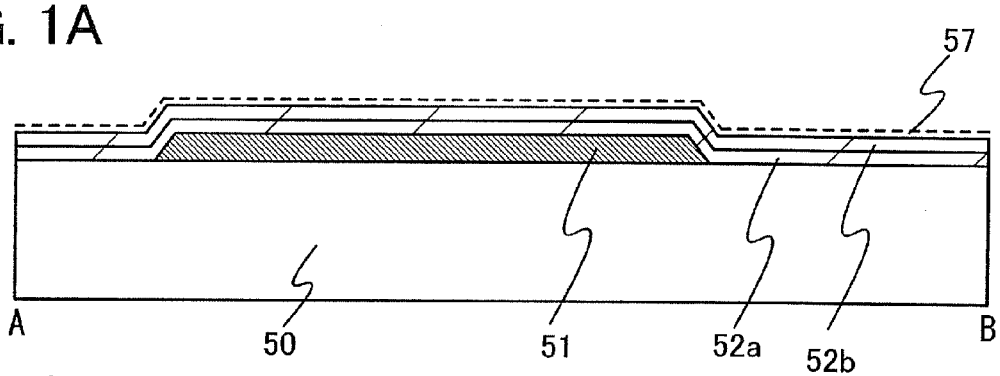
FIGS. 1A to 1D are cross-sectional views illustrating a method for manufacturing a display device of the present invention.

The embodiment modes according to the present invention will hereinafter be described referring to the accompanying drawings. However, the present invention is not limited to the description given below, and it will be readily apparent to those skilled in the art that various changes and modifications in modes and details thereof can be made without departing from the purpose and scope of the present invention. Therefore, the present invention is not construed as being limited to the description of the following embodiment modes. Note that in the structure of the present invention which is hereinafter described, the reference numerals denoting the same portions are used in common in different drawings. Note that an arrangement of each device in a production system described in embodiment modes below is an example and it should not be interpreted as being limited to the arrangement illustrated in the drawing as long as it is an arrangement by which a similar operation effect is obtained.

Embodiment Mode 1

In this embodiment mode, manufacturing processes of thin film transistors will be described with reference to FIGS. 1A to 17. FIGS. 1A to 1D, FIGS. 2A and 2B, FIGS. 5A and 5B, FIGS. 9A to 9C, FIGS. 10A and 10B FIGS. 12A and 12B, FIGS. 14A to 14C, FIGS. 15A and 15B, and FIG. 17 are cross-sectional views illustrating manufacturing steps of thin film transistors, and FIGS. 11A to 11C and FIGS. 16A to 16C are top views each illustrating a connection region of a thin film transistor and a pixel electrode in a single pixel.

A thin film transistor having a microcrystalline semiconductor film, which is of an n-type, is more suitable for use in a driver circuit than that of a p-type because it has a higher mobility. It is desirable that all thin film transistors formed over the same substrate have the same polarity, in order to reduce the number of manufacturing steps. Here, description is made using an n-channel thin film transistor.

As illustrated in FIG. 1A, a gate electrode 51 is formed over a substrate 50. A gate insulating films 52a and 52b are formed over the gate electrode 51.

As the substrate 50, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. Alternatively, metal substrates of a stainless alloy and the like with the surface provided with an insulating film may be employed.

The gate electrode 51 is formed using a metal material. As a metal material, aluminum, chromium, titanium, tantalum, molybdenum, copper, or the like is used. A the gate electrode 51 is preferably formed using aluminum or a stacked layer structure of aluminum and a barrier metal. As the barrier metal, refractory metal such as titanium, molybdenum, or chromium is applied. The barrier metal is preferably provided so as to prevent hillock or oxidation of aluminum. In this embodiment mode, a molybdenum film is formed as a conductive film over the substrate 50 by a sputtering method, and is etched using a mask pattern formed using a first photomask, to form the gate electrode.

The gate electrode 51 is formed to have a thickness of greater than or equal to 50 nm and less than or equal to 300 nm. The gate electrode 51 is formed to have a thickness of greater than or equal to 50 nm and less than or equal to 100 nm, whereby disconnection of a semiconductor film and a wiring to be formed later can be prevented. The gate electrode 51 is formed to have a thickness of greater than or equal to 150 nm and less than or equal to 300 nm, which leads to reduction in resistance of the gate electrode 51 and increase in area.

Note that, because a semiconductor film and a wiring are to be formed over the gate electrode 51, it is desirable that the gate electrode 51 be processed so that its end portions are tapered in order to prevent disconnection. In addition, although not illustrated, in this step, a wiring connected to the gate electrode or a capacitor wiring can also be formed at the same time.

The gate insulating films 52a and 52b can each be formed by a CVD method, a sputtering method, or the like using a silicon oxide film, a silicon nitride film, a silicon oxynitride film, or a silicon nitride oxide film. Here, a mode is described in which a silicon nitride film or a silicon nitride oxide film is formed as the gate insulating film 52a and a silicon oxide film or a silicon oxynitride film is formed as the gate insulating film 52b to be stacked. Note that the gate insulating film can be formed as not a two-layer film but a single layer of a silicon oxide film, a silicon nitride film, a silicon oxynitride film or silicon nitride oxide film.

Alternatively, three layers of gate insulating films can be formed as follows: a silicon nitride film or a silicon nitride oxide film is formed over the gate electrode, a silicon oxide film or a silicon oxynitride film is formed thereover and a silicon nitride film or a silicon nitride oxide film with a thickness of approximately 1 nm to 5 nm is formed thereover.

As a method for forming a silicon nitride film with a thickness of approximately 1 nm to 5 nm, nitridation treatment is performed on the gate insulating film 52b utilizing high-density plasma, so that a silicon nitride film can be formed over a surface of the gate insulating film 52b. By high-density plasma nitridation, a silicon nitride film that contains nitrogen at a higher concentration can be obtained. The high-density plasma is generated by use of high-frequency microwaves, for example, microwaves with a frequency of 2.45 GHz. In high-density plasma that has the characteristic of having a low electron temperature, since the kinetic energy of an active species is low, a layer can be formed with less plasma damage and fewer defects compared to a layer formed by conventional plasma treatment. In addition, because the surface of the gate insulating film 52b can be made less rough, carrier mobility can be increased.

When the gate insulating film 52a is formed using a silicon nitride film or a silicon nitride oxide film, adhesion between the substrate 50 and the gate insulating film 52a is increased, and further, impurities from the substrate 50 can be prevented from diffusing into the microcrystalline semiconductor film when a glass substrate is used for the substrate 50. Furthermore, oxidation of the gate electrode 51 can be prevented. That is, film separation can be prevented, and electric characteristics of a thin film transistor which is to be formed later can be improved. Further, the gate insulating films 52a and 52b with a thickness of greater than or equal to 50 nm are preferable because the gate insulating films 52a and 52b with the above thickness can alleviate reduction in coverage caused by unevenness due to the gate electrode 51.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 atoms % to 70 atoms %, 0.5 atoms % to 15 atoms %, 25 atoms % to 35 atoms %, and 0.1 atoms % to 10 atoms %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 atoms % to 30 atoms %, 20 atoms % to 55 atoms %, 25 atoms % to 35 atoms %, and 10 atoms % to 30 atoms %, respectively. Note that percentages of nitrogen, oxygen, silicon, and hydrogen fall within the ranges given above, where the total number of atoms contained in the silicon oxynitride film or the silicon nitride oxide film is defined as 100 atoms %.

Figure 1B:
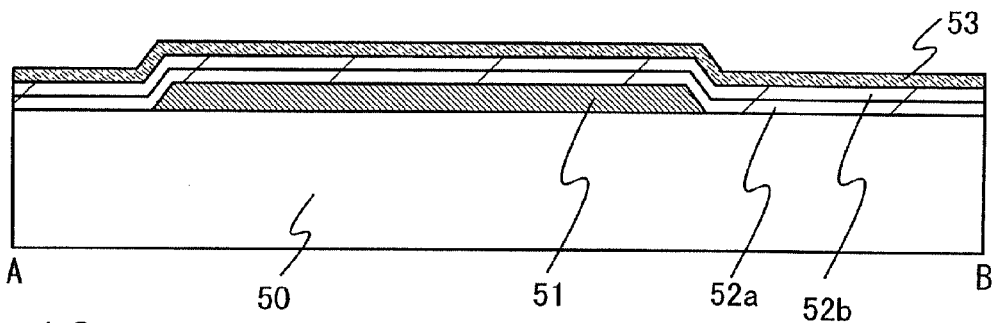

Next, a microcrystalline semiconductor film is formed over the gate insulating film 52b so that an amorphous layer is not formed at the interface between the surface of the gate insulating film 52b and the microcrystalline semiconductor film. Specifically, crystal nuclei 57 are formed on the gate insulating film 52b. Next, crystal growth is generated using the crystal nuclei 57 as nuclei to form a microcrystalline semiconductor film 53 as illustrated in FIG. 1B.

Hereinafter, as a method for forming the microcrystalline semiconductor film 53, a step of forming a microcrystalline silicon film as a typical example will be described in chronological order with reference to FIG. 4. Further, a process for forming the crystal nuclei and a film formation process will be described with reference to FIG. 2A and 2B and FIG. 3 which are enlarged cross-sectional views of the interface between the gate insulating film and the microcrystalline semiconductor film.

FIG. 4 is a time chart illustrating a process for forming a microcrystalline semiconductor film, and illustrates a typical example. Illustration of FIG. 4 starts from a stage of vacuum evacuation 440 of a reaction chamber which is under atmospheric pressure, then, treatment stages of substrate installation 441, pre-base treatment 442, formation treatment 443 of crystal nuclei, deposition treatment 444, substrate removal 445, and cleaning 446 are illustrated in chronological order.

First, vacuum evacuation is performed on a reaction chamber to the predetermined degree of vacuum. When high vacuum evacuation is performed, evacuation is performed by the turbo-molecular pump, or the like, and further, vacuum evacuation with a pressure lower than $10^{-1}$ Pa is performed. In addition, it is preferable to perform heat treatment for the reaction chamber and then degas the inner wall. Further, a temperature is stabilized by operating the heater for heating the substrate. The temperature for heating the substrate is 100° C. to 300° C., preferably 120° C. to 280° C., more preferably 120° C. to 220° C.

In the step of substrate installation 441, a substrate is carried from a load lock chamber which is connected to a reaction chamber. Pressure in the reaction chamber at this time is the same as that in the load lock chamber.

In pre-base treatment 442, plasma treatment is preferably performed by introducing hydrogen and further a rare gas such as argon in order to remove a gas which adsorbed to the inner wall of the reaction chamber (atmosphere components such as oxygen and nitrogen, or an etching gas used for cleaning the reaction chamber). A rare gas element having a large mass number, such as argon, krypton, or xenon, is preferably used for rare gas plasma treatment. This is for removing oxygen, moisture, an organic substance, a metal element, and the like, which are attached to a surface by the effect of sputtering. Hydrogen plasma treatment is effective for removing the impurity adsorbed to the surface and for forming a clean surface by etching an insulating film or an amorphous silicon film by a hydrogen radical. Note that since a gas is introduced into the reaction chamber, pressure of the reaction chamber at this time is setting pressure.

Note that in the pre-base treatment 442, as illustrated by a dashed line 447, a fluorosilane gas may be introduced to the reaction chamber to remove an impurity and form a clean surface in a similar manner to hydrogen plasma treatment or rare gas plasma treatment.

Figure 2A:
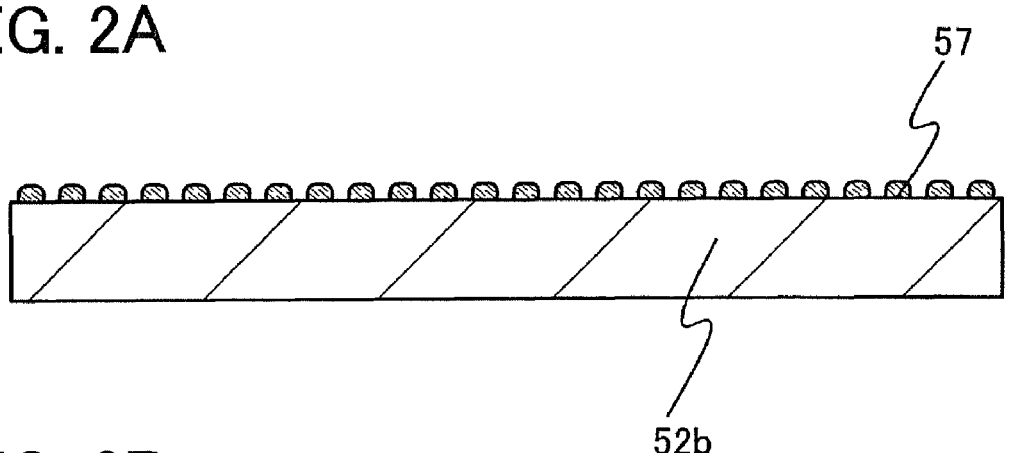
FIGS. 2A and 2B are cross-sectional views illustrating a method for manufacturing a display device of the present invention.

In the formation treatment 443 of crystal nuclei, fluorine or a fluoride of hydrogen, silicon, germanium, or the like, here, fluorosilane; hydrogen; and a gas which is deposited including silicon or germanium, here, silane are mixed in the reaction chamber, so that the crystal nuclei are formed by glow discharge plasma. By glow discharge plasma, fluorine radicals are generated from fluorosilane. Fluorine radicals have high reactivity and etch selectively an amorphous semiconductor which is easily etched as compared to a microcrystalline semiconductor. Therefore, crystal nuclei each of which is a microcrystalline semiconductor are easily formed selectively. As a result, as illustrated in FIG. 2A, crystal nuclei 57 can be deposited on the gate insulating film 52b. Note that high electric power is required in order to decompose fluorosilane and form the crystal nuclei. A silane chloride can be used instead of fluorine or fluoride of hydrogen, silicon, germanium, or the like.

Figure 2B:
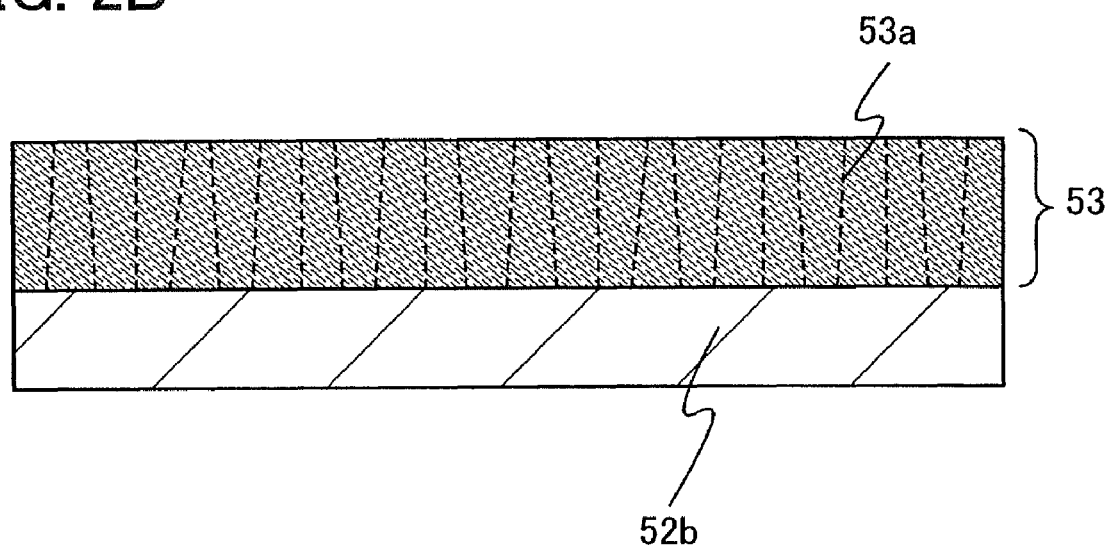

Deposition treatment 444 illustrated in FIG. 4 in which a microcrystalline silicon film is formed is treatment following the formation treatment 443 of crystal nuclei. The microcrystalline silicon film is deposited by glow discharge plasma by mixing a silane gas and hydrogen and/or a rare gas. A silane gas is diluted with hydrogen and/or a rare gas by from 10 to 2000 times. Therefore, a large amount of hydrogen and/or rare gas is required. A temperature for heating the substrate is from 100 to 300° C., preferably from 120 to 220° C. It is preferable that deposition be performed at a temperature of 120 to 220° C. in order that a growing surface of the microcrystalline silicon film is inactivated with hydrogen, and growth of microcrystalline silicon is promoted. In the deposition treatment 444, a SiH radical, a $SiH_2$ radical, and a $SiH_3$ radical which are active species are combined with the crystal nuclei 57, so that crystal growth is generated. As a result, the microcrystalline semiconductor film 53 can be formed. At this time, since longitudinal growth of the microcrystalline semiconductor occurs using the crystal nuclei 57 as nuclei, crystal growth is generated in the normal direction with respect to the gate insulating film 52b, so that as illustrated in FIG. 2B, the microcrystalline semiconductor film 53 in which columnar microcrystals 53a are aligned can be formed. That is, the microcrystalline semiconductor film can be formed on the gate insulating film without forming an amorphous layer at an interface between the gate insulating film and the microcrystalline semiconductor film. Further, the crystal nuclei are formed using fluorosilane only in the formation treatment 443 of crystal nuclei and fluorosilane is not used in the deposition treatment 444 in which the microcrystalline semiconductor film is formed, whereby the concentration of fluorine contained in the microcrystalline semiconductor film can be reduced. Furthermore, since the microcrystalline semiconductor film is formed using silane without fluorosilane, generation of stress of the film can be reduced as compared to a case of forming the microcrystalline semiconductor film using fluorosilane, so that film separation can be reduced.

Electric power in the deposition treatment 444 in which the microcrystalline semiconductor film is formed is made to be lower than that in the formation treatment 443 of crystal nuclei, whereby ion bombardment to the crystal nuclei can be reduced and crystal growth can be generated without destroying the crystal nuclei.

Note that in the deposition treatment 444, as illustrated by a dashed line 448, fluorosilane flow rate of which is smaller than that in the formation treatment 443 of crystal nuclei is introduced into the reaction chamber, whereby amorphous semiconductor components in the microcrystalline semiconductor film can be etched by fluorine radicals, so that the proportion of microcrystalline components in the microcrystalline semiconductor film 53 can be increased.

Further, germanium hydride such as $GeH_4$ or germanium fluoride such as $GeF_4$ may be mixed into a gas such as silane to adjust the energy band to be 0.9 eV to 1.1 eV. When germanium is added to silicon, temperature characteristics of a thin film transistor can be changed.

Figure 3:
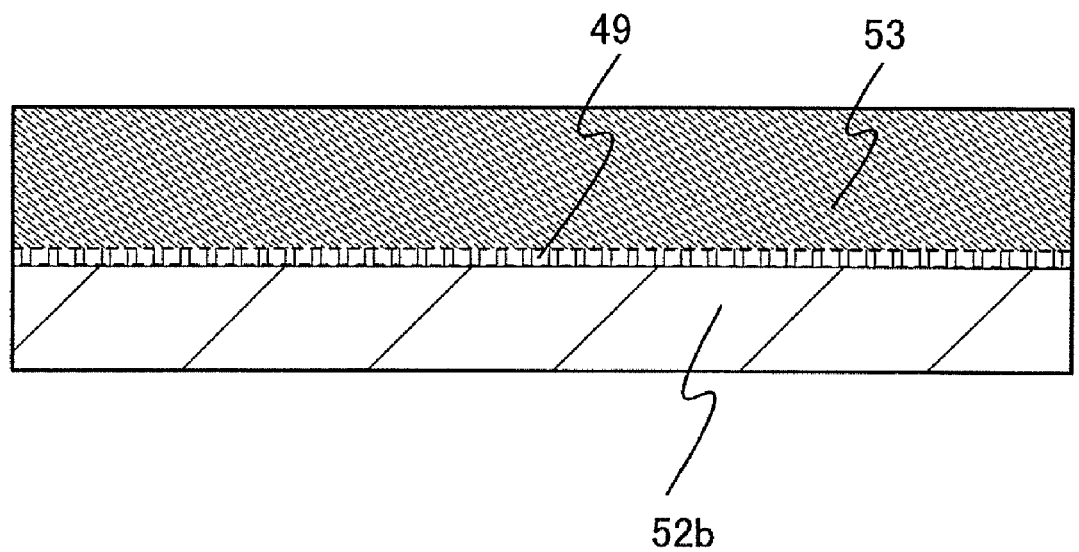
FIG. 3 is a cross-sectional view illustrating a conventional method for manufacturing a display device.

In a conventional method for forming a microcrystalline semiconductor film, as illustrated in FIG. 3, an amorphous layer 49 is formed in the initial stage of deposition due to a factor such as an impurity or lattice mismatch. Since carriers flow in the microcrystalline semiconductor film in the vicinity of the gate insulating film in a thin film transistor, formation of the amorphous layer 49 at the interface leads to decrease in mobility and a small amount of current, and thus the electric characteristics of the thin film transistor are impaired.

However, as described in this embodiment mode, by the formation treatment of crystal nuclei and the deposition treatment, longitudinal growth of the microcrystalline semiconductor occurs using the crystal nuclei 57 as nuclei; therefore, the crystallinity of the entire microcrystalline semiconductor film can be assured, and the crystallinity at the interface between the gate insulating film and the microcrystalline semiconductor film can be increased.

Plasma is generated by applying a high-frequency power of from 1 MHz to 20 MHz, typically 13.56 MHz, or high-frequency power of greater than 20 MHz and less than or equal to approximately 120 MHz in the VHF band, as described in this embodiment mode. Alternatively, a microwave power with a frequency of greater than or equal to 1 MHz may be applied.

Note that the semiconductor film is precoated in a reaction chamber of a plasma CVD apparatus before the substrate installation 441, whereby the microcrystalline silicon film can be prevented from containing impurities which are metal of the reaction chamber. In other words, the reaction chamber is covered by silicon, so that the reaction chamber can be prevented from being etched by plasma and the concentration of impurities in the microcrystalline silicon film can be reduced.

In the stage of deposition treatment 444, helium may be added to a reactive gas in addition to silane and hydrogen. Helium has ionization energy of 24.5 eV, which is the highest ionization energy in all gases, and has a metastable state in a level of about 20 eV which is a little lower than the level of the ionization energy. Thus, only about 4 eV, which is the difference between the ionization energy and the metastable state, is needed for ionization while discharge is maintained. Therefore, a discharge starting voltage of helium shows the lowest value in all gases. By such characteristics, helium can hold plasma stably. In addition, uniform plasma can be formed so that plasma density is equalized even when the area of the substrate on which a microcrystalline silicon film is deposited is increased.

After deposition of the microcrystalline silicon film is completed, the supply of a reactive gas such as silane and hydrogen and high-frequency power is stopped to perform the substrate removal 445. When deposition treatment is performed on another substrate sequentially, the same treatment is performed from the stage of the substrate installation 441. The cleaning 446 is performed to remove a film or powder which is attached to the reaction chamber.

For the cleaning 446, plasma etching is performed by introducing an etching gas typified by $NF_3$ and $SF_6$. Alternatively, the cleaning 446 is performed by introducing a gas such as $ClF_3$ which can perform etching without using plasma. In the stage of the cleaning 446, it is preferable to turn off the heater in order that a temperature for heating the substrate is low. This is for suppressing generation of a by-product of reaction by etching. After completion of the cleaning 446, the same treatment may be performed from the stage of substrate installation 441.

Here, the microcrystalline semiconductor film is a film which contains a semiconductor having an intermediate structure between amorphous and crystalline structures (including a single crystal and a polycrystal). This semiconductor is a semiconductor which has a third state that is stable in terms of free energy, and is a crystalline semiconductor which has a short-range order and lattice distortion, and columnar or needle-like crystals grain size of which is 0.5 nm to 20 nm are grown in a normal direction with respect to a surface of a substrate. In addition, a microcrystalline semiconductor and an amorphous semiconductor are mixed. Microcrystalline silicon, which is a typical example of a microcrystalline semiconductor, has a Raman spectrum which is shifted to a lower wave number side than 520 $cm^{-1}$ that represents single-crystal silicon. That is, the peak of a Raman spectrum of microcrystalline silicon is within the range from 480 $cm^{-1}$ which represents amorphous silicon to 520 $cm^{-1}$ which represents single-crystal silicon. In addition, microcrystalline silicon is made to contain hydrogen or halogen of at least 1 at. % or more for termination of dangling bonds. Moreover, microcrystalline silicon is made to contain a rare gas element such as helium, argon, krypton, or neon to further enhance lattice distortion, whereby stability is increased and a favorable microcrystalline semiconductor film can be obtained. Such a microcrystalline semiconductor film is disclosed in, for example, U.S. Pat. No. 4,409,134.

The microcrystalline semiconductor film 53 is formed to have a thickness of greater than or equal to 1 nm and less than or equal to 200 nm, preferably, greater than or equal to 1 nm and less than or equal to 100 nm, more preferably, greater than or equal to 1 nm and less than or equal to 50 nm. The microcrystalline semiconductor film 53 serves as a channel formation region of a thin film transistor which is to be formed later. Further, the microcrystalline semiconductor film 53 may be etched to make the thickness thereof small. When the thickness of the microcrystalline semiconductor film 53 is greater than or equal to 1 nm and less than or equal to 50 nm, a thin film transistor of a complete depletion type can be manufactured.

A microcrystalline semiconductor film exhibits weak n-type conductivity when an impurity element for valence control is not intentionally added. Thus, threshold control of a microcrystalline semiconductor film which functions as a channel formation region of a thin film transistor can be achieved by addition of an impurity element which imparts p-type conductivity at the same time as or after the film formation. A typical example of an impurity element which imparts p-type conductivity is boron, and an impurity gas such as $B_2H_6$ or $BF_3$ may be mixed into silicon hydride at a proportion of 1 ppm to 1000 ppm, preferably, 1 ppm to 100 ppm. The concentration of boron may be set to be, for example, $1 \times 10^{14}$ atoms/$cm^3$ to $6 \times 10^{16}$ atoms/$cm^3$.

In addition, the oxygen concentration of the microcrystalline semiconductor film is preferably less than or equal to $5 \times 10^{19}$ atoms/$cm^3$, more preferably, less than or equal to $1 \times 10^{19}$ atoms/$cm^3$ and each of the nitrogen concentration and the carbon concentration is preferably less than or equal to $3 \times 10^{18}$ atoms/$cm^3$. By decreases in concentrations of oxygen, nitrogen, and carbon to be mixed into the microcrystalline semiconductor film, the microcrystalline semiconductor film can be prevented from being changed into an n-type.

Furthermore, because the microcrystalline semiconductor film 53 contains microcrystals, it has a lower resistance than an amorphous semiconductor film. A thin film transistor in which the microcrystalline semiconductor film 53 is used for a channel formation region has current-voltage characteristics represented by a curve with a steep slope in a rising portion, has an excellent response as a switching element, and can be operated at high speed. With the use of the microcrystalline semiconductor films 53 in channel formation regions of thin film transistors, fluctuation of a threshold value of thin film transistors can be suppressed. Therefore, a display device with less variation of electrical characteristics can be manufactured.

The microcrystalline semiconductor film 53 has a higher mobility than an amorphous semiconductor film. Thus, with the use of a thin film transistor, a channel formation region of which is formed of the microcrystalline semiconductor film 53, for switching of a display element, the area of the channel formation region, that is, the area of the thin film transistor can be decreased. Accordingly, the area of the thin film transistor in a single pixel is decreased, and an aperture ratio of the pixel can be increased. As a result of this, a display device with high resolution can be manufactured.

Figure 1C:
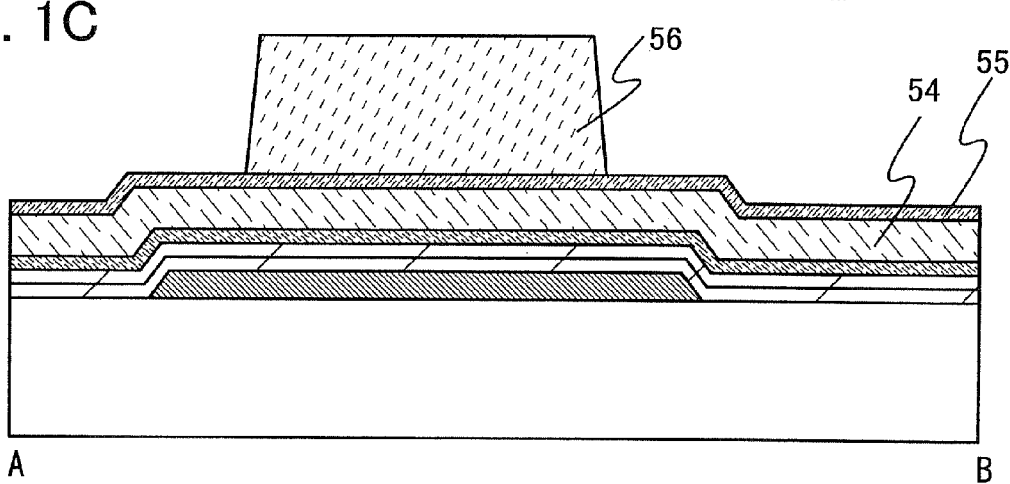

Next, as illustrated in FIG. 1C, a semiconductor film 55 to which an impurity element imparting one conductivity type is added and a buffer layer 54 are formed over the microcrystalline semiconductor film 53. Next, a mask pattern 56 is formed over the semiconductor film 55 to which an impurity element imparting one conductivity type is added.

As the buffer layer 54, an amorphous semiconductor film can be formed by a plasma CVD method using a silane gas. Alternatively, with a dilution of silane gas with one or plural kinds of rare gas elements selected from helium, argon, krypton, and neon, an amorphous semiconductor film can be formed. With the use of hydrogen at a flow rate which is preferably, greater than or equal to 1 times and less than or equal to 10 times, more preferably, greater than or equal to 1 times and less than or equal to 5 times higher than that of a silane gas, a hydrogen-containing amorphous semiconductor film can be formed. Further, nitrogen or halogen such as fluorine or chlorine may be added to the amorphous semiconductor film.

Alternatively, as the buffer layer 54, an amorphous semiconductor film can be formed by sputtering with hydrogen or a rare gas using a semiconductor such as silicon, germanium, or the like as a target.

The buffer layer 54 is preferably formed using an amorphous semiconductor film which does not contain crystal grains. Therefore, when the buffer layer 54 is formed by a microwave plasma CVD method or a high-frequency plasma CVD method with a frequency of several tens to several hundreds of megahertz, formation conditions are preferably controlled so that an amorphous semiconductor film does not contain crystal grains.

In some cases, the buffer layer 54 is partly etched in a later step of formation of source and drain regions. The buffer layer 54 is preferably formed to have a thickness such that a part thereof is left remaining after the etching. It is preferable that the thickness of a remaining portion after etching be typically greater than or equal to 30 nm and less than or equal to 500 nm, preferably greater than or equal to 50 nm and less than or equal to 100 nm. In a display device, typically in a liquid crystal display device, including a thin film transistor to which high voltage (e.g., about 15 V) is applied, when the buffer layer 54 is formed to have a large thickness, drain withstand voltage becomes high. Thus, deterioration of the thin film transistor can be reduced even when high voltage is applied to the thin film transistor.

By formation of an amorphous semiconductor film, moreover, an amorphous semiconductor film containing hydrogen, nitrogen, or halogen on the surface of the microcrystalline semiconductor film 53, surfaces of crystal grains contained in the microcrystalline semiconductor film 53 can be prevented from being oxidized naturally. In particular, in a region where an amorphous semiconductor is in contact with microcrystal grains, a crack is likely to be caused due to local stress. When this crack is exposed to oxygen, the crystal grains are oxidized, whereby silicon oxide is formed. However, by formation of the buffer layer 54 on the surface of the microcrystalline semiconductor film 53, the microcrystal grains can be prevented from being oxidized.

Since the buffer layer 54 is formed using an amorphous semiconductor film or an amorphous semiconductor film containing hydrogen, nitrogen, or halogen, the buffer layer 54 has a larger energy gap than the microcrystalline semiconductor film 53 and has a higher resistance, and has a lower mobility, i.e., a fifth to a tenth of that of the microcrystalline semiconductor film 53. Therefore, in a thin film transistor to be formed later, the buffer layer formed between source and drain regions and the microcrystalline semiconductor film 53 functions as a high-resistance region and the microcrystalline semiconductor film 53 functions as a channel formation region. Accordingly, the off current of the thin film transistor can be reduced. When the thin film transistor is used as a switching element of a display device, the contrast of the display device can be improved.

Note that after formation of the microcrystalline semiconductor film 53, the buffer layer 54 is preferably deposited at a temperature of 300° C. to 400° C. by a plasma CVD method. By this deposition treatment, hydrogen is supplied to the microcrystalline semiconductor film 53, and the same effect as in the case of hydrogenation of the microcrystalline semiconductor film 53 can be achieved. That is, by deposition of the buffer layer 54 over the microcrystalline semiconductor film 53, hydrogen is diffused into the microcrystalline semiconductor film 53, so that dangling bonds can be terminated.

In the case where an n-channel thin film transistor is to be formed, to the semiconductor film 55 to which an impurity element imparting one conductivity type is added, phosphorus may be added as a typical impurity element, and an impurity gas such as $PH_3$ may be added to silicon hydride. In the case where a p-channel thin film transistor is to be formed, boron may be added as a typical impurity element, and an impurity gas such as $B_2H_6$ may be added to silicon hydride. The semiconductor film 55 to which an impurity element imparting one conductivity type is added can be formed of a microcrystalline semiconductor or an amorphous semiconductor. The semiconductor film 55 to which an impurity element imparting one conductivity type is added is formed to have a thickness of greater than or equal to 2 nm and less than or equal to 50 nm. By making the thickness of the semiconductor film to which an impurity element imparting one conductivity type is added small, throughput can be improved.

Next, an example of a structure which is suitable for deposition of a gate insulating film, a microcrystalline semiconductor film, and the like will be described as an example of a plasma CVD apparatus to which the reaction chambers are applied.

Figure 7:
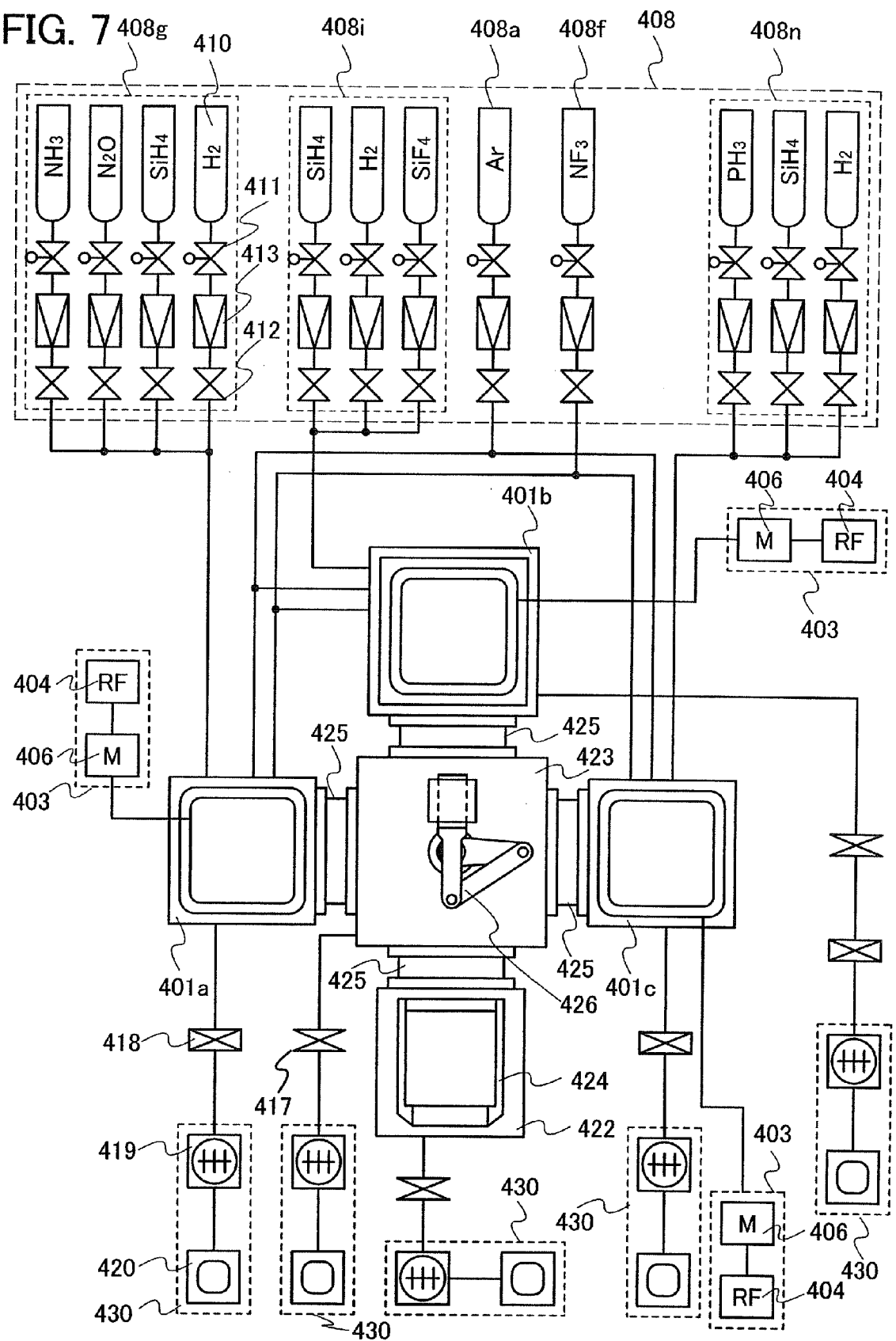
FIG. 7 is a diagram illustrating a structure of a plasma CVD apparatus which can be applied to the present invention.

FIG. 7 illustrates an example of a multi-chamber plasma CVD apparatus provided with a plurality of reaction chambers. The apparatus is provided with a common chamber 423, a load/unload chamber 422, a first reaction chamber 401a, a second reaction chamber 401b, and a third reaction chamber 401c. The plasma CVD apparatus treats a single-wafer at a time, and substrates loaded in a cassette in the load/unload chamber 422 are carried in and out of each chamber by a transport mechanism 426 of the common chamber 423. Each gate valve 425 is provided between the common chamber 423 and each chamber such that treatments performed in chambers do not interfere each other.

Reaction chambers are separated depending on the kind of a thin film to be formed. For example, an insulating film such as a gate insulating film is deposited in the first reaction chamber 401a, a microcrystalline semiconductor film for channel formation and a buffer layer are deposited in the second reaction chamber 401b, and a semiconductor film to which an impurity element imparting one conductivity type is added and which forms a source region and a drain region is deposited in the third reaction chamber 401c. It is needless to say that the number of reaction chambers is not limited to this, and the number of reaction chambers can be increased or decreased as necessary. One film may be deposited in one reaction chamber, or a plurality of films may be deposited in one reaction chamber.

The turbo-molecular pump 419 and the dry pump 420 are connected to each reaction chamber as an exhaust means 430. The exhaust means 430 is not limited to a combination of these vacuum pumps, and another vacuum pump can be used as long as exhaust can be performed to a degree of vacuum approximately from $10^{-1}$ Pa to $10^{-5}$ Pa. The butterfly valve 417 is provided between the exhaust means 430 and each reaction chamber, which can interrupt vacuum evacuation, and the conductance valve 418 can control exhaust velocity to adjust pressure in each reaction chamber.

The gas supply means 408 includes the cylinder 410 in which a gas used for the process, such as a rare gas or a semiconductor source gas typified by silane, is filled, the stop valves 411 and 412, the mass flow controller 413, and the like. A gas supply means 408g is connected to the first reaction chamber 401a and supplies a gas for depositing a gate insulating film. A gas supply means 408i is connected to the second reaction chamber 401b and supplies a gas for forming crystal nuclei, a microcrystalline semiconductor film and a buffer layer. A gas supply means 408n is connected to the third reaction chamber 401c and supplies a gas for forming an n-type semiconductor film, for example. A gas supply means 408a supplies hydrogen, a gas supply means 408f is a system for supplying an etching gas used for cleaning the reaction chamber, and these are common lines for reaction chambers.

A high-frequency power supply means 403 for generating plasma is connected to each reaction chamber. The high-frequency power supply means 403 includes the high-frequency power source 404 and the matching box 406.

Figure 8:
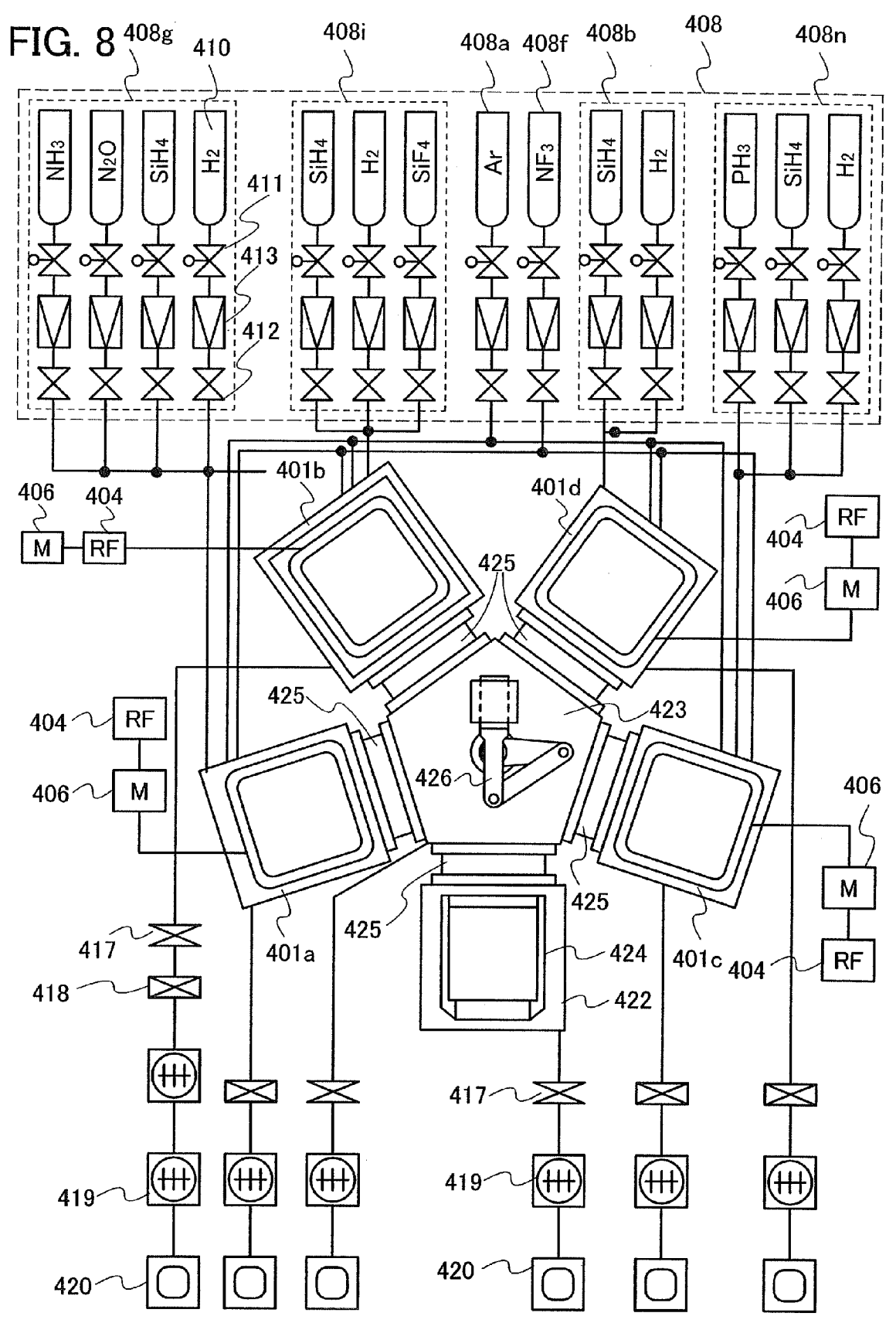

FIG. 8 illustrates a structure in which a fourth reaction chamber 401d is added to the structure of the multi-chamber plasma CVD apparatus in FIG. 7. A gas supply means 408b is connected to the fourth reaction chamber 401d. The structures of a high frequency power supply means and an exhaust means are similar to those of the multi-chamber plasma CVD apparatus in FIG. 7. Reaction chambers can be used for different purposes depending on the kind of a thin film to be formed. For example, an insulating film such as a gate insulating film is deposited in the first reaction chamber 401a, crystal nuclei and a microcrystalline semiconductor film which forms a channel formation region are deposited in the second reaction chamber 401b, a buffer layer which protects a microcrystalline semiconductor film which is to be a channel formation region is formed in the fourth reaction chamber 401d, and a semiconductor film to which an impurity element imparting one conductivity type is added and which forms a source region and a drain region is deposited in the third reaction chamber 401c. Since the most suitable deposition temperature depends on each film, a deposition temperature can be easily managed by separating reaction chambers individually. Further, the same kind of films can be repeatedly deposited, so that influence of residual impurities attributed to a film formed previously can be prevented.

Figure 5A:
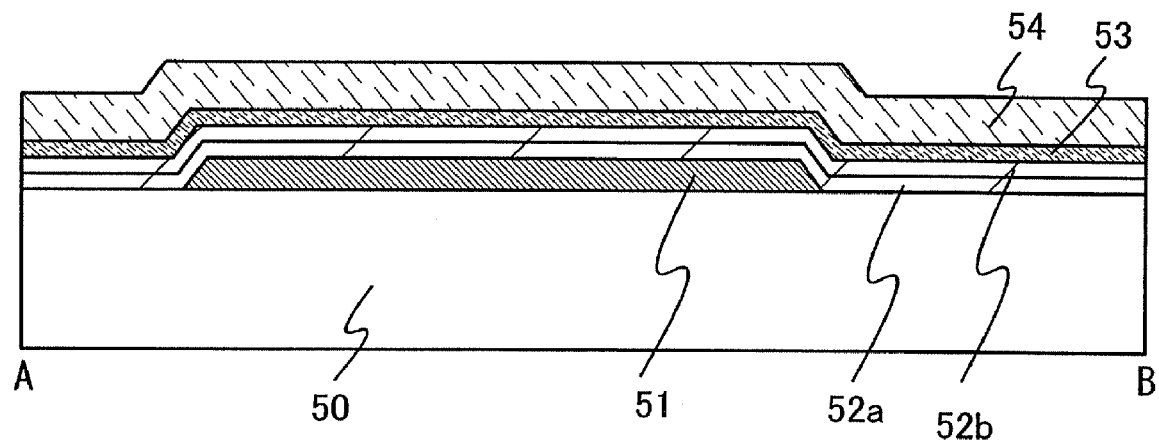
FIGS. 5A and 5B are cross-sectional views illustrating a method for manufacturing a display device of the present invention.
Figure 5B:
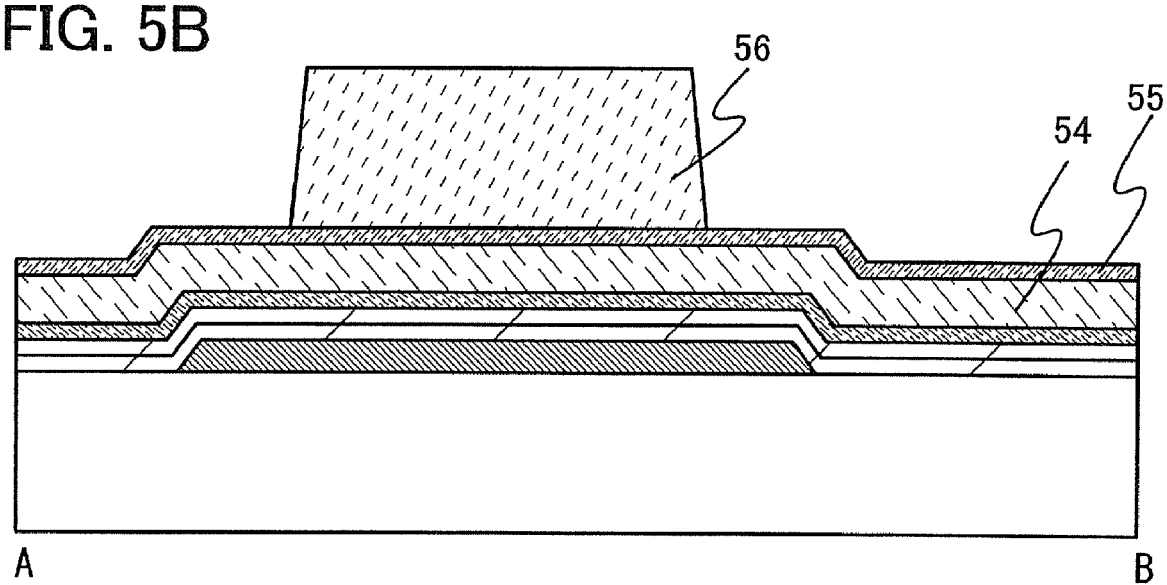

Note that here, as illustrated in FIGS. 1B and 1C, a mode in which the microcrystalline semiconductor film 53 and the buffer layer 54 are formed in different steps is described; however, as illustrated in FIGS 5A and 5B, the microcrystalline semiconductor film 53 and the buffer layer 54 may be formed successively. Specifically, as illustrated in FIG. 1A, the crystal nuclei 57 are formed on the gate insulating film 52b. Next, as illustrated in FIG. 5A, crystal growth is generated using the crystal nuclei as nuclei to form the microcrystalline semiconductor film 53, and then the buffer layer 54 is formed successively without being exposed to the atmosphere. After this, as illustrated in FIG. 5B, the semiconductor film 55 to which an impurity element imparting one conductivity type is added is formed over the buffer layer 54.

Figure 6:
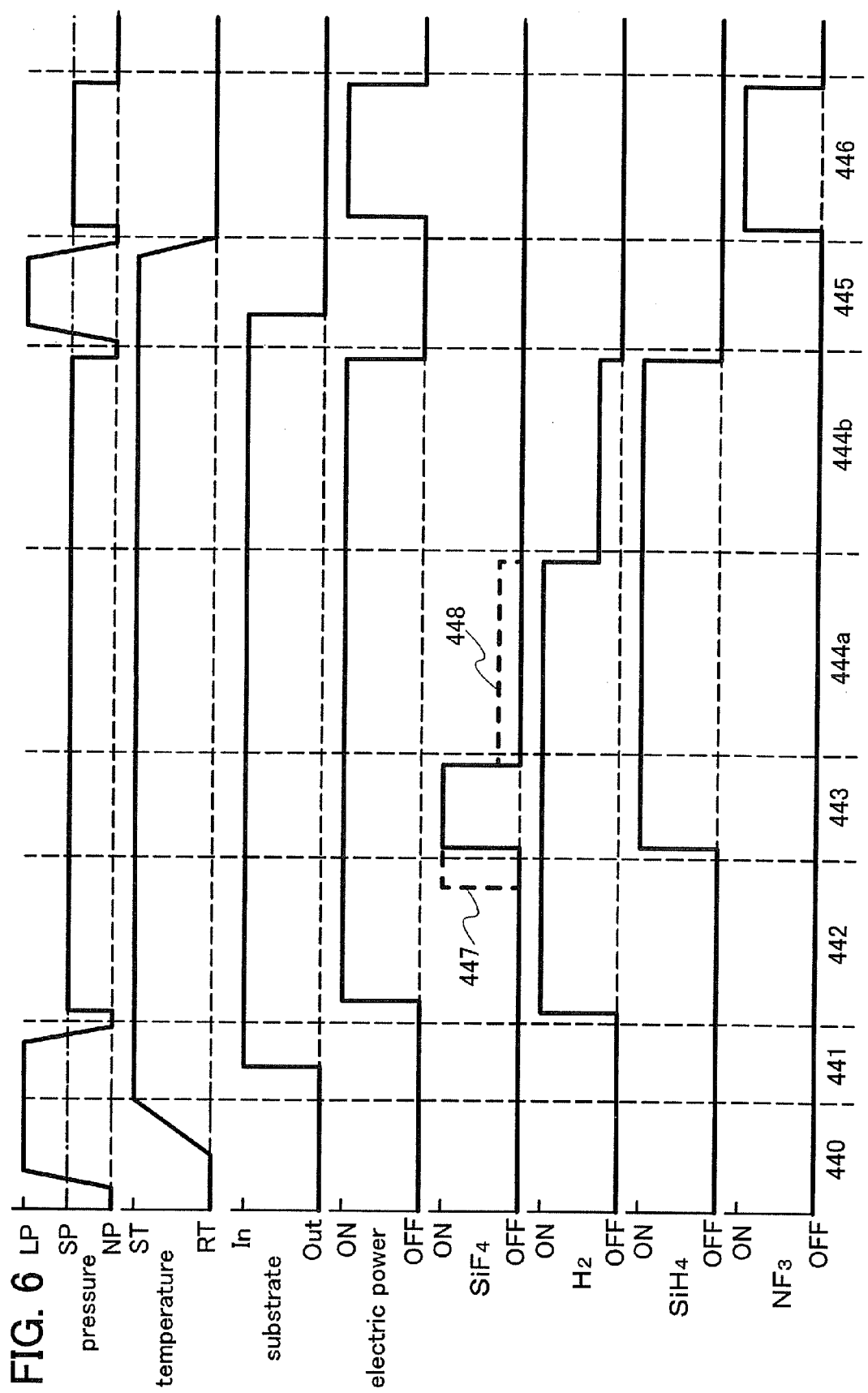
FIG. 6 illustrates an example of a time chart illustrating a process for forming a microcrystalline silicon film and a buffer layer.

FIG. 6 is a time chart illustrating a process for forming the microcrystalline semiconductor film 53 and the buffer layer 54 successively, and illustrates a typical example. Illustration of FIG. 6 starts from a stage of vacuum evacuation 440 of a reaction chamber which is under atmospheric pressure, then, treatment stages of substrate installation 441, pre-base treatment 442, formation treatment 443 of crystal nuclei, deposition treatment 444a of the microcrystalline semiconductor film, deposition treatment 444b of the buffer layer, substrate removal 445, and cleaning 446 are illustrated in chronological order. Note that vacuum evacuation 440, then, treatment stages of substrate installation 441, pre-base treatment 442, formation treatment 443 of crystal nuclei, substrate removal 445, and cleaning 446 are performed in a similar manner to the steps illustrated in FIG. 4. Here, deposition treatment 444b of the buffer layer is performed between deposition treatment 444a of the microcrystalline semiconductor film and substrate removal 445.

Deposition treatment 444b in which the buffer layer is formed is treatment following deposition treatment 444a of the microcrystalline silicon film. The buffer layer is deposited by glow discharge plasma by mixing a silane gas and hydrogen and/or a rare gas. Silane is diluted with hydrogen and/or a rare gas by greater than or equal to 1 and less than 10 times, preferably greater than or equal to 1 and less than or equal to 5 times, and an amorphous semiconductor film can be formed. The temperature for heating the substrate is 100° C. to 300° C., preferably 120° C. to 280° C., more preferably 120° C. to 220° C.

Note that the buffer layer may be formed using silane without introducing hydrogen into the reaction chamber. The flow rate of silane is increased drastically in deposition treatment 444b of the buffer layer as compared to deposition treatment 444a of the microcrystalline semiconductor film; therefore, the power supply is turned off after deposition treatment 444a of the microcrystalline semiconductor film, the flow rate of silane, hydrogen, or the like is set again, and then the power supply is turned on; thus, the buffer layer may be formed.

The microcrystalline semiconductor film 53 and the buffer layer 54 are formed successively, whereby the interface between stacked layers can be formed without being contaminated by an atmospheric constituent or a contaminant impurity element floating in the atmosphere. Thus, variations in characteristics of thin film transistors can be reduced.

Next, as illustrated in FIG 1C, the mask pattern 56 is formed over the semiconductor film 55 to which an impurity element imparting one conductivity type is added.

The mask pattern 56 is formed by a photolithography technique. Here, with the use of a second photomask, the mask pattern 56 is formed by exposing a resist that is applied over the semiconductor film 55 to which an impurity element imparting one conductivity type is added, to light and developing the resist.

Figure 1D:
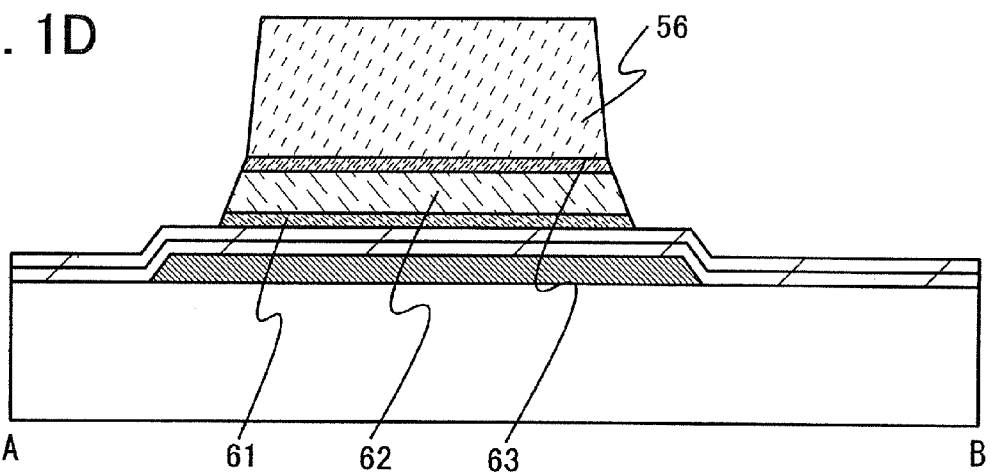

Next, the microcrystalline semiconductor film 53, the buffer layer 54, and the semiconductor film 55 to which an impurity imparting one conductivity type is added are divided by etching using the mask pattern 56 to form a microcrystalline semiconductor film 61, a buffer layer 62, and a semiconductor film 63 to which an impurity imparting one conductivity type is added, as illustrated in FIG. 1D. After that, the mask pattern 56 is removed. Note that FIG. 1D (except the mask pattern 56) corresponds to a cross-sectional view taken along a line A-B of FIG. 11A.

The side faces in the end portions of the microcrystalline semiconductor film 61 and the buffer layer 62 are inclined, so that leakage current can be prevented from flowing between the microcrystalline semiconductor film 61 and the source and drain regions formed over the buffer layer 62. In addition, generation of leakage current between wiring layers and the microcrystalline semiconductor film 61 can also be prevented. The inclination angle of the side faces in the end portions of the microcrystalline semiconductor film 61 and the buffer layer 62 is from 30° to 90°, preferably from 45° to 80°. By adopting such an angle, disconnection of a wiring layer due to a step shape can be prevented.

Figure 9A:
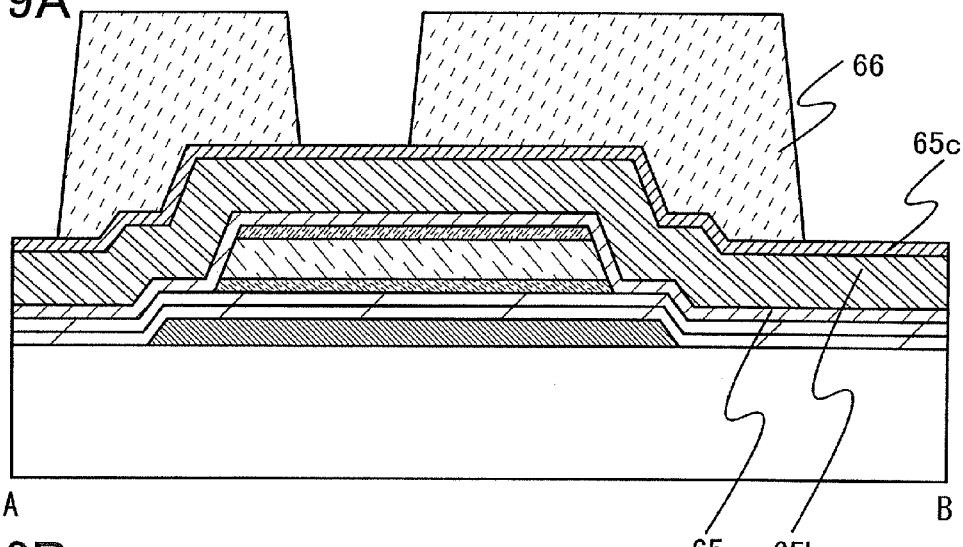
FIGS. 9A to 9C are cross-sectional views illustrating the method for manufacturing the display device of the present invention.

Next, as illustrated in FIG. 9A, conductive films 65a to 65c are formed over the semiconductor film 63 to which an impurity imparting one conductivity type is added and the gate insulating film 52b, and a mask pattern 66 is formed over the conductive films 65a to 65c. It is preferable that the conductive films 65a to 65c be formed using a single layer or a stacked layer of aluminum, copper, or an aluminum alloy to which an element to improve heat resistance or an element to prevent a hillock such as silicon, titanium, neodymium, scandium, or molybdenum is added. Alternatively, the conductive film may have a stacked-layer structure where a film on the side in contact with the semiconductor film to which an impurity element imparting one conductivity type is added is formed of titanium, tantalum, molybdenum, tungsten, or nitride of any of these elements and an aluminum film or an aluminum alloy film is formed thereover. Still alternatively, the conductive film may have a stacked-layer structure where an aluminum film or an aluminum alloy film is sandwiched between upper and lower films of titanium, tantalum, molybdenum, tungsten, or nitride of any of these elements. Here, as the conductive film, a conductive film with a three-layer structure where conductive films 65a to 65c are stacked is described. A stacked-layer conductive film where molybdenum films are used as the conductive films 65a and 65c and an aluminum film is used as the conductive film 65b or a stacked-layer conductive film where titanium films are used as the conductive films 65a and 65c and an aluminum film is used as the conductive film 65b can be given. The conductive films 65a to 65c are formed by a sputtering method or a vacuum evaporation method.

The mask pattern 66 can be formed in a similar manner to the mask pattern 56.

Figure 9B:
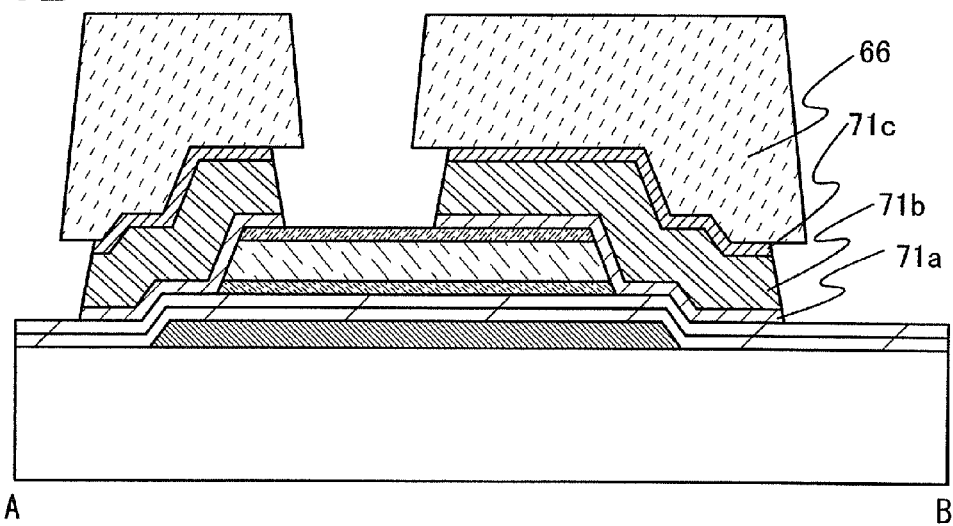

Next, as illustrated in FIG. 9B, the conductive films 65a to 65c are partially etched to form a pair of wiring layers 71a to 71c (which serves as source and drain electrodes). Here, the conductive films 65a to 65c are wet-etched using the mask pattern 66 that is formed by a photolithography process using a third photomask, so that the end portions of the conductive films 65a to 65c are etched isotropically. As a result, the wiring layers 71a to 71c having a smaller area than the mask pattern 66 can be formed.

Figure 9C:
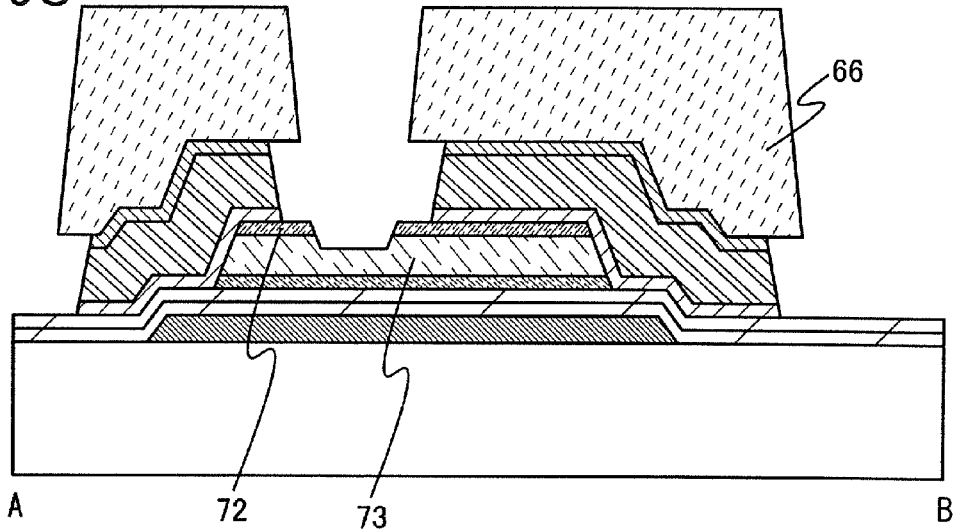

Subsequently, the semiconductor film 63 to which an impurity element imparting one conductivity type is added is etched to be separated using the mask pattern 66. As a result, a pair of source and drain regions 72 can be formed, as illustrated in FIG. 9C. In this etching process, a part of the buffer layer 62 is also etched. The buffer layer which is etched partly and has a concave portion is referred to as a buffer layer 73. The source and drain regions and the concave portion of the buffer layer can be formed in the same process. The concave portion of the buffer layer is formed with a depth which is ½ to ⅓ of the largest thicknesses of the buffer layer, so that a leak path between the source and drain regions can be long; thus, leakage current between the source and drain regions can be reduced. After this, the mask pattern 66 is removed.

Figure 11A:
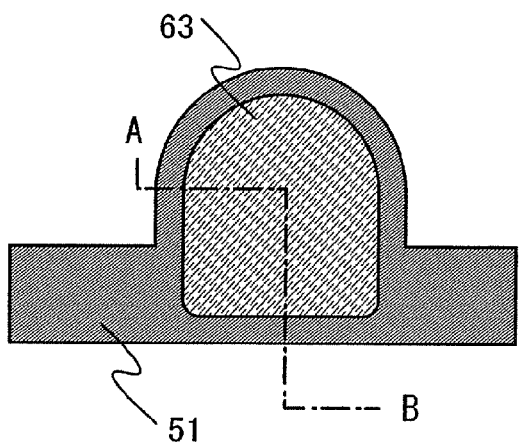
FIGS. 11A to 11C are top views illustrating the method for manufacturing the display device of the present invention.
Figure 11B:
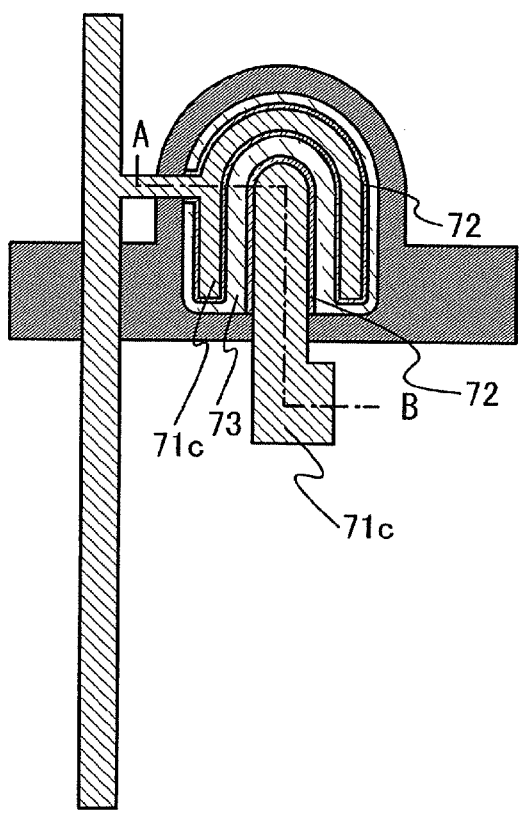
Figure 11C:
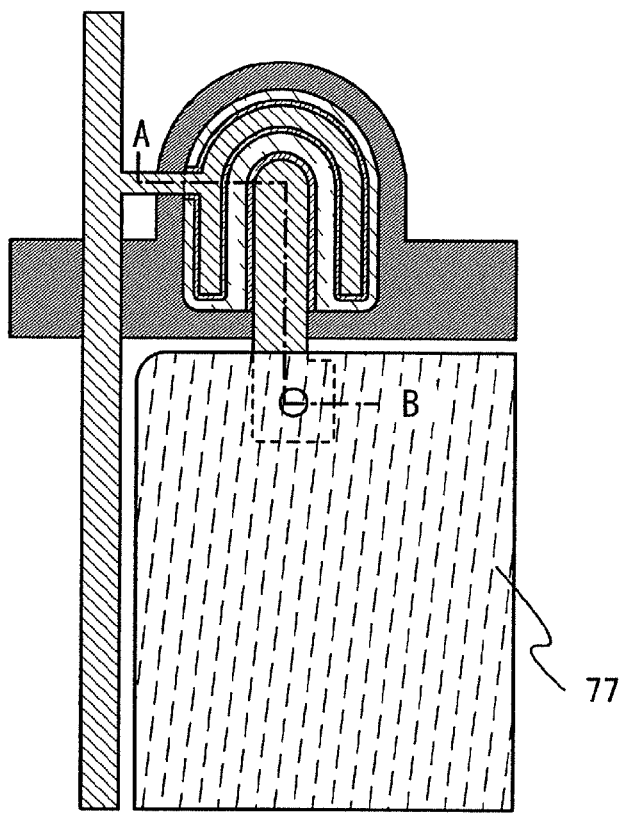

Note that FIG. 9C (except the mask pattern 66) corresponds to a cross sectional view taken along a line A-B in FIG. 11B. As illustrated in FIG. 11B, end portions of the source and drain regions 72 stick out more than those of the wiring layer 71c. Further, end portions of the buffer layer 73 stick out more than those of the wiring layer 71c and those of the source and drain regions 72. Further, one of the wiring layers has a shape by which the other of the wiring layers is surrounded (specifically, a U shape or a C shape). Thus, an area in which carriers can move can be increased, and thus the amount of current can be increased and an area for a thin film transistor can be reduced. Further, unevenness of the gate electrode has little influence on the films and layers thereover because the microcrystalline semiconductor film and the wiring layers are formed to overlap with the gate electrode, whereby reduction in coverage is realized and generation of leakage current can be suppressed.

Through the above-described process, a channel-etch thin film transistor 74 can be formed.

Figure 10A:
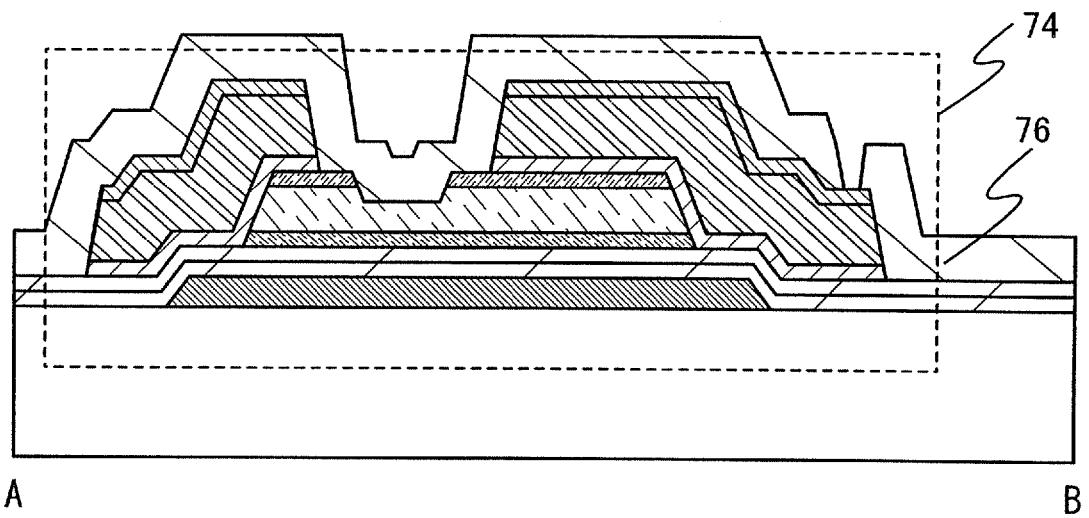
FIGS. 10A and 10B are cross-sectional views illustrating the method for manufacturing the display device of the present invention.
Figure 10B:
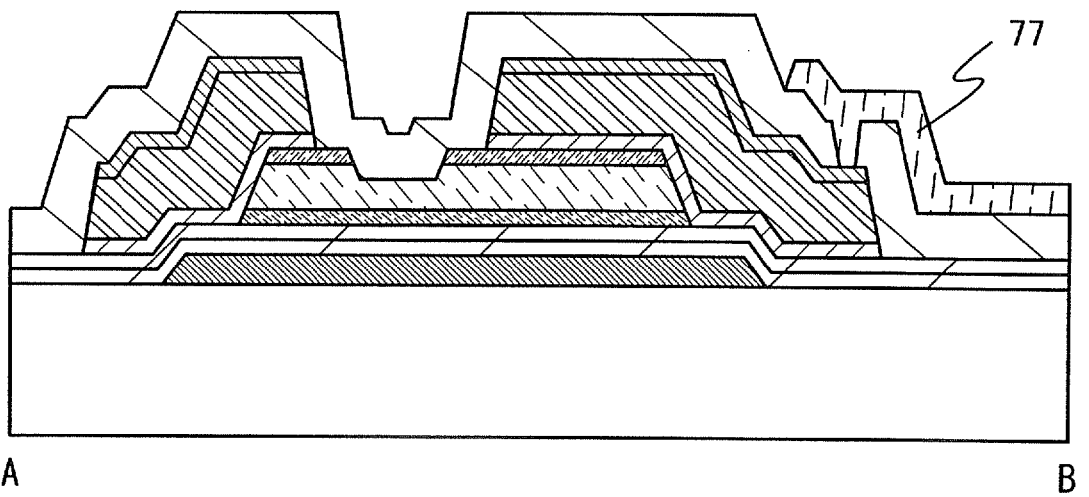

Next, as illustrated in FIG. 10A, a protective insulating film 76 is formed over the wiring layers 71a to 71c, the source and drain regions 72, the buffer layer 73, the microcrystalline semiconductor film 61, and the gate insulating film 52b. The protective insulating film 76 can be formed in a similar manner to the gate insulating films 52a and 52b. Note that the protective insulating film 76 is provided to prevent entry of a contaminant impurity such as an organic substance, a metal substance, or moisture floating in the atmosphere and is preferably a dense film. By use of a silicon nitride film as the protective insulating film 76, the oxygen concentration in the buffer layer 73 can be made to less than or equal to be $5\times10^{19}$ atoms/cm$^3$, preferably, less than or equal to $1\times10^{19}$ atoms/cm$^3$, so that oxidization of the buffer layer 73 can be prevented.

Next, the protective insulating film 76 is partially etched by using a mask pattern formed with a fourth photomask to form a contact hole in the protective insulating film 76. Then, a pixel electrode 77 which is in contact with the wiring layer 71c is formed in the contact hole. Note that FIG. 10B corresponds to a cross-sectional view taken along a line A-B of FIG. 11C.

The pixel electrode 77 can be formed using a light-transmitting conductive material such as indium oxide containing tungsten oxide, indium zinc oxide containing tungsten oxide, indium oxide containing titanium oxide, indium tin oxide containing titanium oxide, ITO, indium zinc oxide, or indium tin oxide to which silicon oxide is added.

Alternatively, the pixel electrode 77 can be formed using a conductive composition containing a conductive high-molecular compound (also referred to as a conductive polymer). It is preferable that the pixel electrode formed using the conductive composition have a sheet resistance of less than or equal to 10000 Ω/square and a light transmittance of greater than or equal to 70% at a wavelength of 550 nm. In addition, it is preferable that the resistivity of the conductive high-molecular compound contained in the conductive composition be less than or equal to 0.1 Ω·cm.

As a conductive high molecule compound, so-called π electron conjugated conductive high molecule compound can be used. For example, polyaniline or a derivative thereof, polypyrrole or a derivative thereof, polythiophene or a derivative thereof, and a copolymer of two or more kinds of those materials can be given.

Here, an ITO film is formed to form the pixel electrode 77 by a sputtering method, and then a resist is applied onto the ITO film. Subsequently, the resist is exposed to light and developed using a fifth photomask, thereby forming a mask pattern. Then, the ITO film is etched using the mask pattern to form the pixel electrode 77.

Through the above process, an element substrate which can be used for a thin film transistor and a display device can be formed.

Next, another method for manufacturing a thin film transistor, which is different from the above modes, will be described with reference to FIGS. 12A and 12B, FIGS. 13A to 13D, FIGS. 14A to 14C, FIGS. 15A and 15B, and FIGS. 16A to 16C. Here, a process will be described in which the number of photomasks can be smaller than that of the above modes and through which a thin film transistor can be manufactured.

Figure 12A:
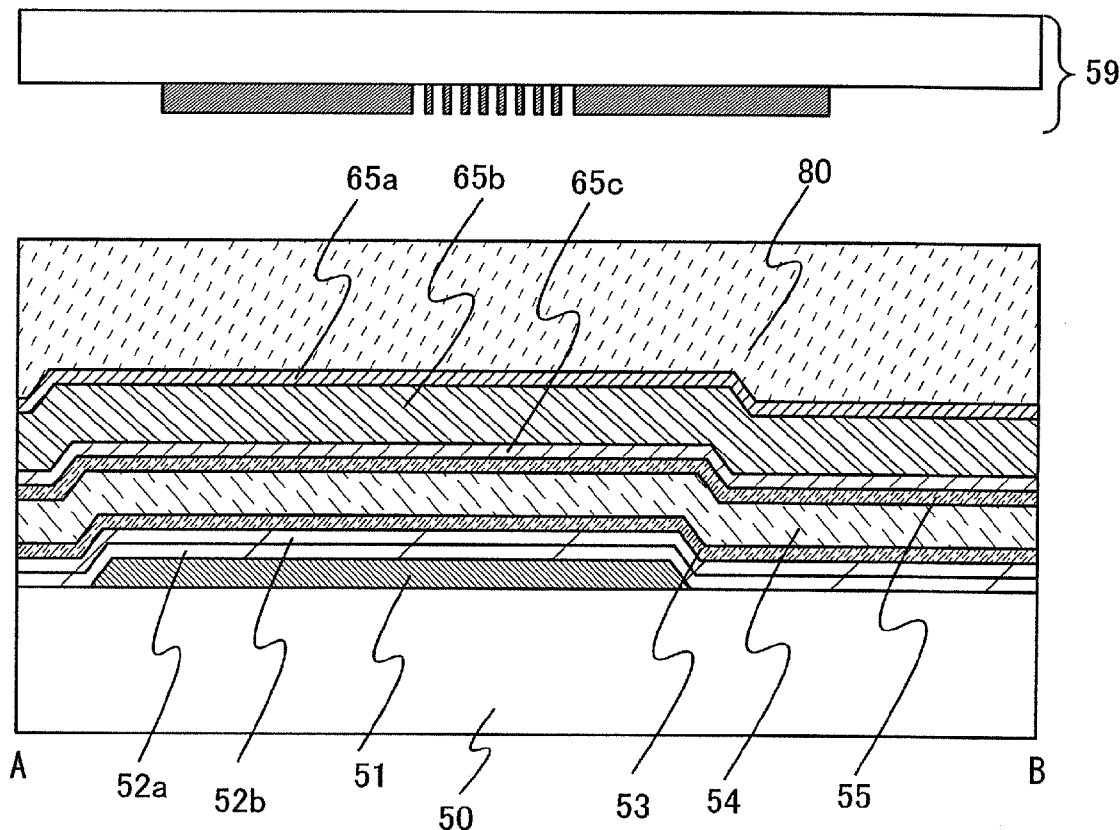
FIGS. 12A and 12B are cross-sectional views illustrating a method for manufacturing a display device of the present invention.

In a similar manner to FIGS. 1A and 1B, a conductive film is formed over a substrate 50; a resist is applied over the conductive film; and part of the conductive film is etched using a mask pattern which is formed by a photolithography process using a first photomask, so that a gate electrode 51 is formed. Next, as illustrated in FIG. 12A, gate insulating films 52a and 52b are formed over the gate electrode 51. By the steps similar to those illustrated in FIGS. 1A and 1B, the crystal nuclei are formed and crystal growth is generated to form the microcrystalline semiconductor film 53. Next, the buffer layer 54, the semiconductor film 55 to which an impurity element imparting one conductivity type is added, and the conductive films 65a to 65c are formed over the microcrystalline semiconductor film 53 in this order. Next, a resist 80 is applied over the conductive film 65a (see FIG. 12A).

As the resist 80, a positive type resist or a negative type resist can be used. Here, a positive type resist is used.

Next, the resist 80 is irradiated with light by using a multi-tone mask 59 as a second photomask, so that the resist 80 is exposed to the light.

Here, the exposure to light using the multi-tone mask 59 will be described with reference to FIGS. 13A to 13D.

A multi-tone mask is a mask which is capable of performing three levels of exposure: fully-exposed, semi-exposed, and non-exposed portions. The multi-tone mask is capable of forming a mask pattern with plural thicknesses (typically, two kinds of thicknesses) by one exposure step and one development step. Therefore, the use of the multi-tone mask makes it possible to reduce the number of photomasks.

As typical examples of the multi-tone mask, there are a gray-tone mask 59a illustrated in FIG. 13A and a half-tone mask 59b illustrated in FIG. 13C.

As illustrated in FIG. 13A, the gray-tone mask 59a includes a light-transmitting substrate 163, and a light-shielding portion 164 and a diffraction grating 165 formed on the light-transmitting substrate 163. The transmittance of light through the light-shielding portion 164 is 0%. On the other hand, the diffraction grating 165 can control the transmittance of light in such a manner that an interval between light-transmitting portions such as slits, dots, or mesh is set to an interval less than or equal to the resolution limit of light used for exposure. Note that either periodic slits, dots, and mesh, or non-periodic slits, dots, and mesh can be used for the diffraction grating 165.

A light-transmitting substrate such as a quartz substrate can be used as the light-transmitting substrate 163. The light-shielding portion 164 and the diffraction grating 165 can be formed using a light-shielding material which absorbs light, such as chromium or chromium oxide.

When the gray-tone mask 59a is irradiated with exposure light, as illustrated in FIG. 13B, transmittance 166 of the light through the light-shielding portion 164 is 0%, whereas the transmittance 166 of the light through the portion where the light-shielding portion 164 and the diffraction grating 165 are not provided is 100%. In addition, the transmittance of light through the diffraction grating 165 can be controlled in the range of 10 to 70%. Control of the transmittance of light through the diffraction grating 165 is possible by controlling an interval between slits, dots, or mesh of the diffraction grating and controlling pitch of the diffraction grating.

As illustrated in FIG. 13C, the half-tone mask 59b includes the light-transmitting substrate 163, and a semi-transmissive portion 167 and a light-shielding portion 168 provided for the light-transmitting substrate 163. MoSiN, MoSi, MoSiO, MoSiON, CrSi, or the like can be used for the semi-transmissive portion 167. The light-shielding portion 168 can be formed using a light-shielding material which absorbs light, such as chromium or chromium oxide.

When the half-tone mask 59b is irradiated with exposure light, as illustrated in FIG. 13D, transmittance 169 of the light through the light-shielding portion 168 is 0%, whereas the transmittance 169 of the light through regions where the light-shielding portion 168 and the semi-transmissive portion 167 are not provided is 100%. In addition, the transmittance of light through the semi-transmissive portion 167 can be controlled in the range of 10 to 70%. Control of the transmittance of light through the semi-transmissive portion 167 is possible by controlling a material of the semi-transmissive portion 167.

Figure 12B:
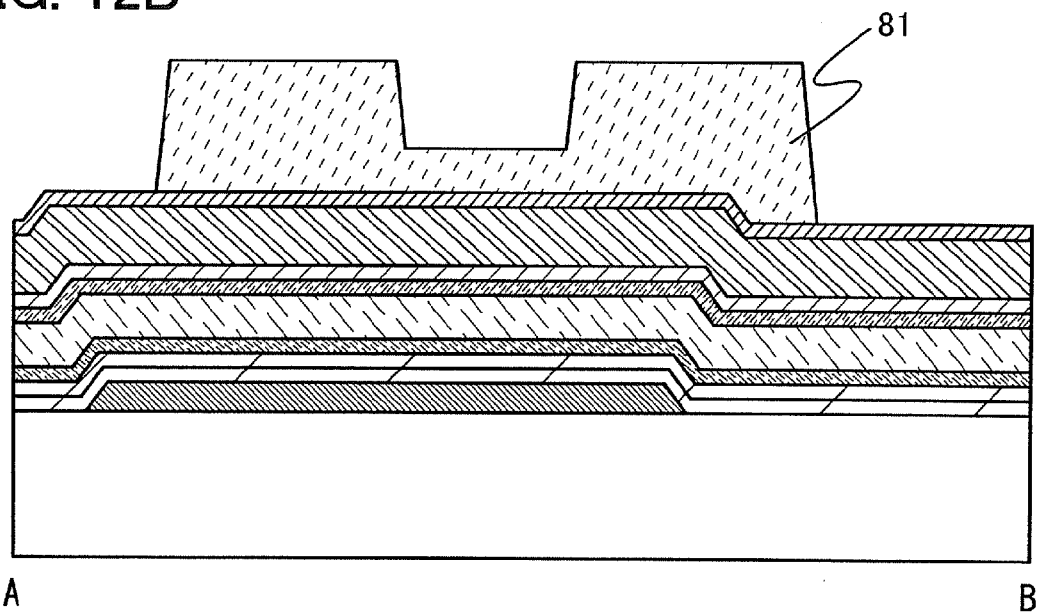

After the exposure to light using the multi-tone mask, development is performed, whereby a mask pattern 81 including regions with different thicknesses can be formed as illustrated in FIG. 12B.

Figure 14A:
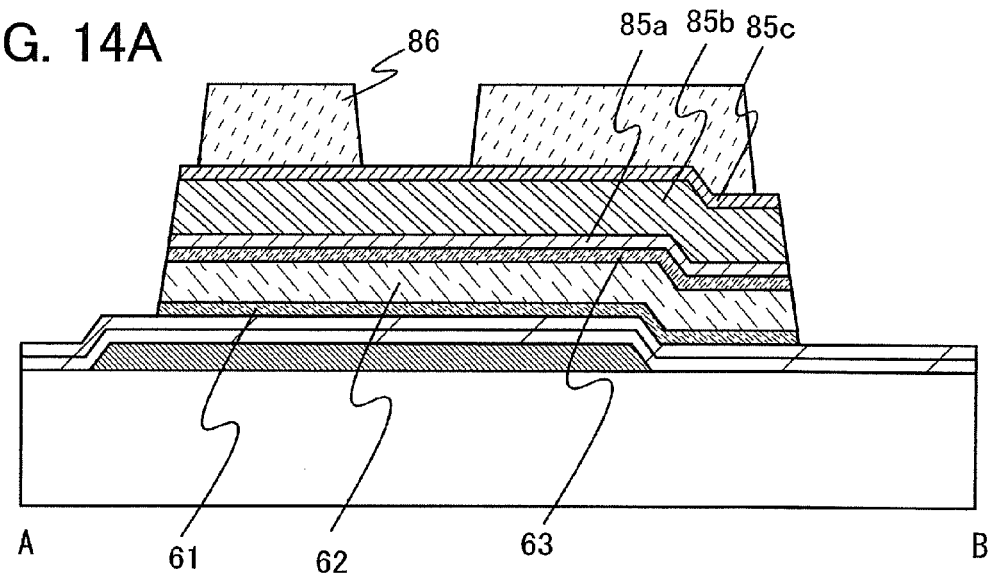
FIGS. 14A to 14C are cross-sectional views illustrating the method for manufacturing the display device of the present invention.

Next, the microcrystalline semiconductor film 53, the buffer layer 54, the semiconductor film 55 to which an impurity element imparting one conductivity type is added, and the conductive films 65a to 65c are divided by etching using the mask pattern 81. As a result, as illustrated in FIG. 14A, a microcrystalline semiconductor film 61, a buffer layer 62, a semiconductor film 63 to which an impurity element imparting one conductivity type is added, and conductive films 85a to 85c can be formed. Note that FIG. 14A (except the mask pattern 81) corresponds to a cross-sectional view taken along a line A-B of FIG. 16A.

Next, ashing is performed on the mask pattern 81, and accordingly the area of the resisit is reduced and the thickness thereof is reduced. At the time of the ashing, the resist in a region with a small thickness (a region overlapping with part of the gate electrode 51) is removed, and divided mask patterns 86 can be formed as illustrated in FIG. 14A.

Figure 14B:
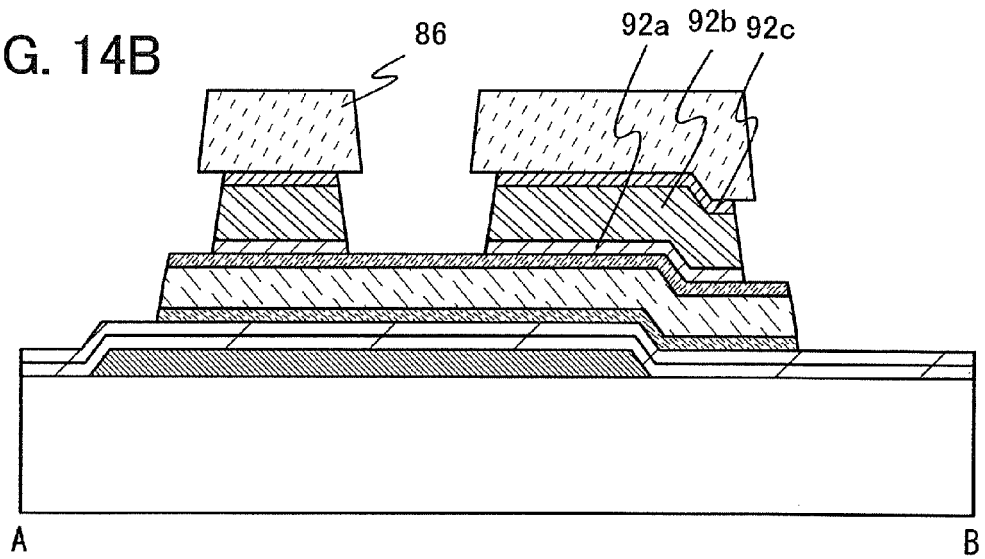

Next, with the use of the mask pattern 86, the conductive films 85a to 85c are divided by etching. As a result, as illustrated in FIG. 14B, a pair of wiring layers 92a to 92c can be formed. The conductive films 85a to 85c are wet-etched with the use of the mask patterns 86, so that the end portions of the conductive films 85a to 85c are etched isotropically. As a result, the wiring layers 92a to 92c having a smaller area than the mask patterns 86 can be formed.

Then, the semiconductor film 63 to which an impurity element imparting one conductivity type is added is etched using the mask pattern 86 to form a pair of source and drain regions 88. Note that, in this etching step, a part of the buffer layer 62 is also etched. The partly etched buffer layer is referred to as a buffer layer 87. Note that a concave portion is formed in the buffer layer 87. The source and drain regions and the concave portion of the buffer layer 87 can be formed in the same step. Here, because the buffer layer 62 is partly etched with use of the mask pattern 86 having a smaller area than the mask pattern 81, end portions of the buffer layer 87 stick out more than those of the source and drain regions 88. After this, the mask patterns 86 are removed. The end portions of the wiring layers 92a to 92c are not aligned with the end portions of the source and drain regions 88, and the end portions of the source and drain regions 88 are formed on an outer side than the end portions of the wiring layers 92a to 92c.

Figure 14C:
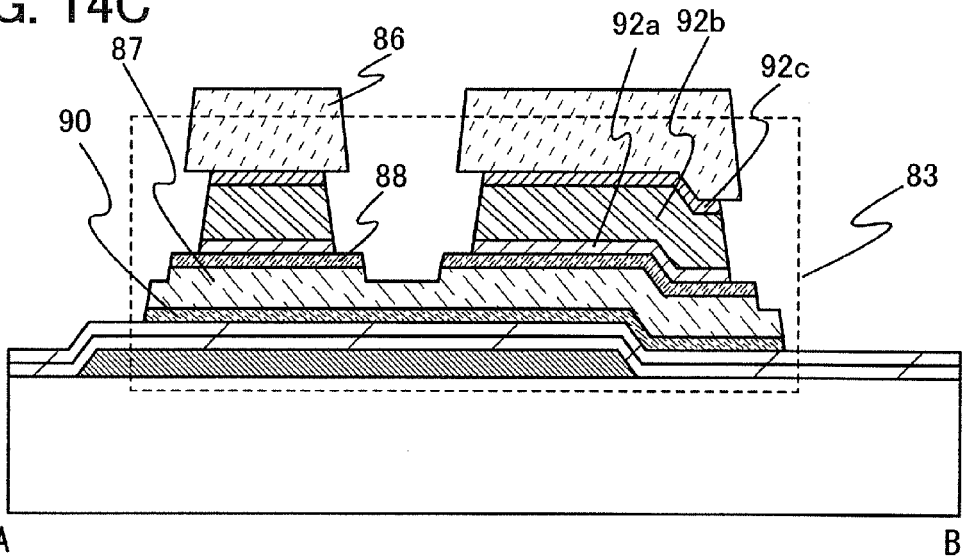

As illustrated in FIG. 14C, the end portions of the wiring layers 92a to 92c are not aligned with the end portions of the source and drain regions 88, whereby the end portions of the wiring layers 92a to 92c and the end portions of the source and drain regions 88 are away from each other. Thus, leak current or a short circuit between the wiring layers can be prevented. Accordingly, a highly reliable thin film transistor can be manufactured. Note that FIG. 14C (except the mask pattern 86) corresponds to a cross-sectional view taken along a line A-B in FIG. 16B.

Through the above-described steps, a channel-etched thin film transistor 83 can be manufactured. In addition, the thin film transistor can be formed using two photomasks.

Figure 15A:
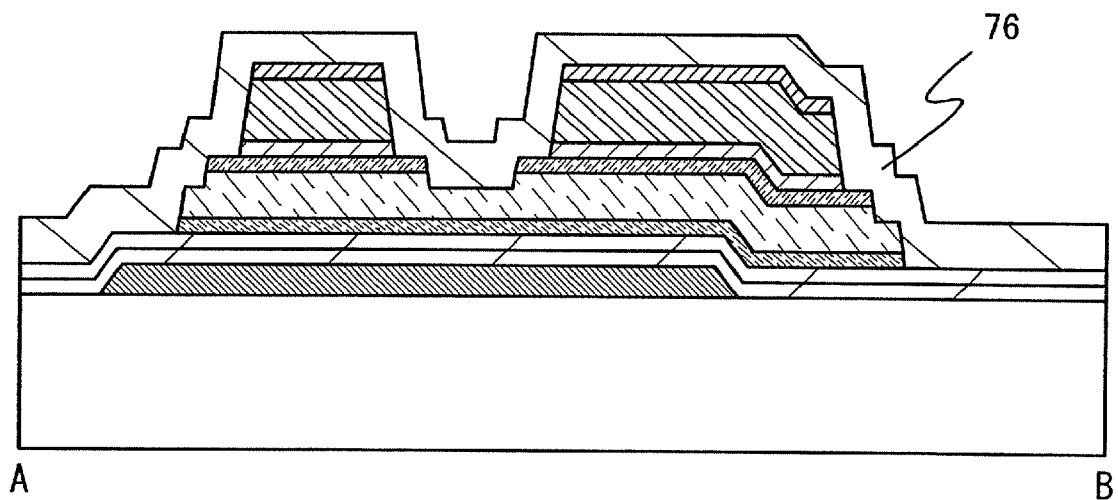
FIGS. 15A and 15B are cross-sectional views illustrating the method for manufacturing the display device of the present invention.
Figure 15B:
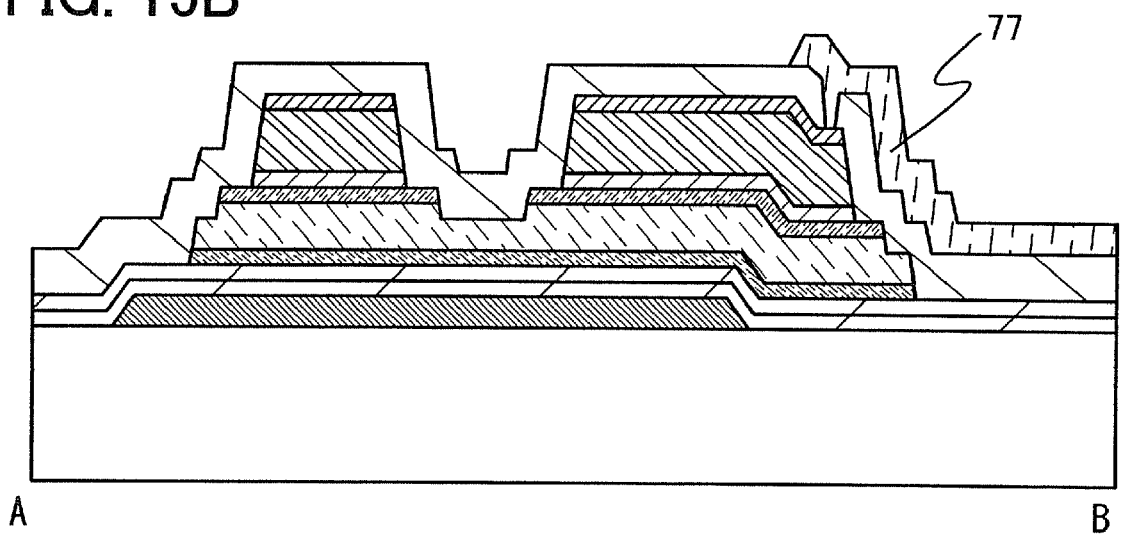
Figure 16A:
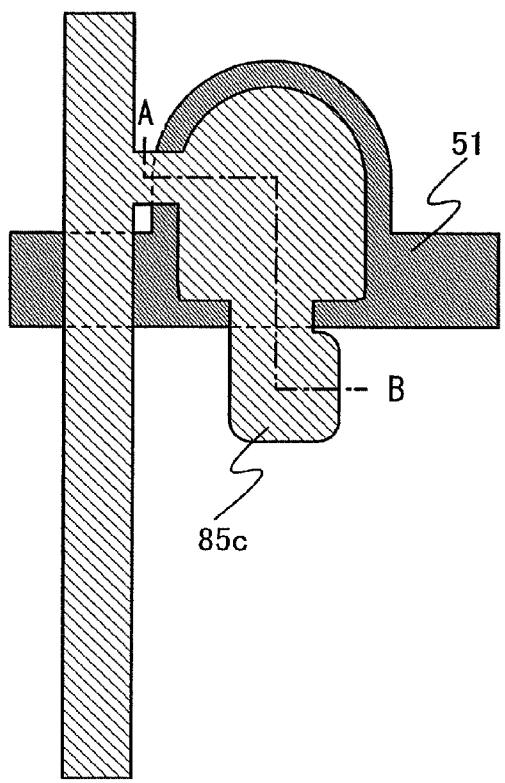
FIGS. 16A to 16C are top views illustrating the method for manufacturing the display device of the present invention.
Figure 16B:
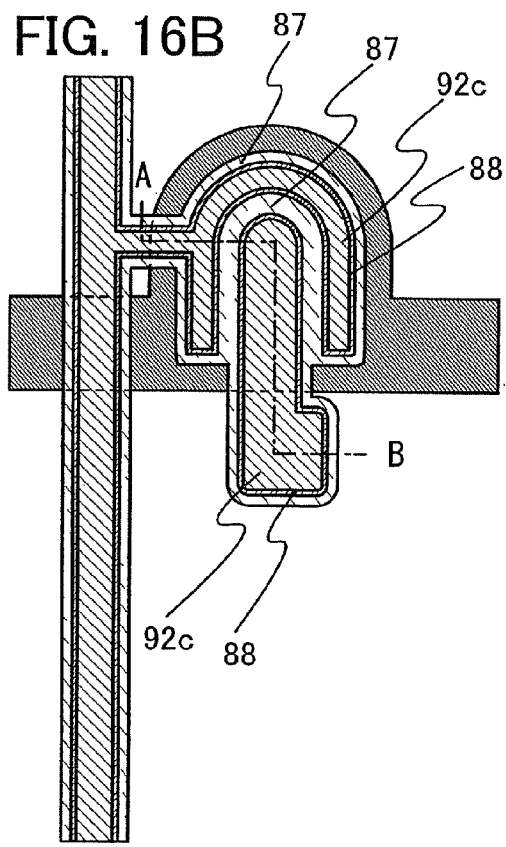
Figure 16C:
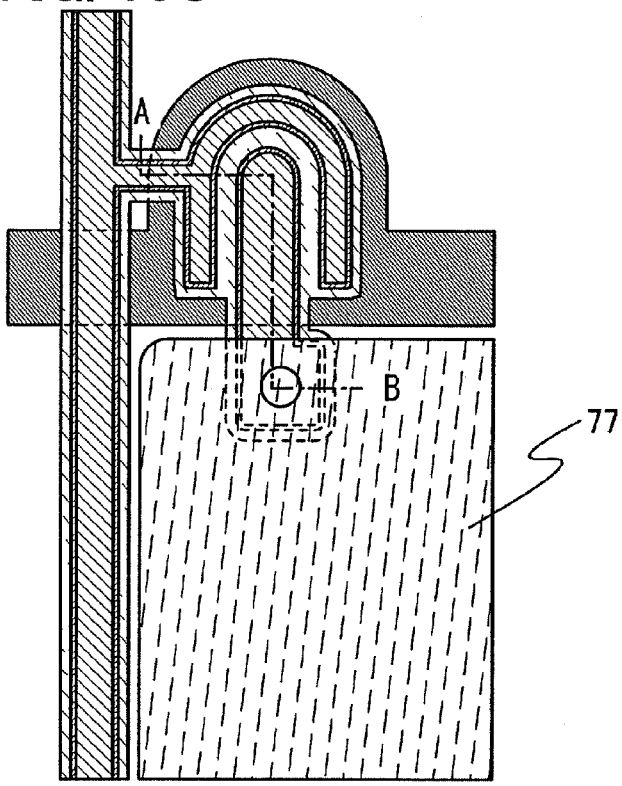

Next, as illustrated in FIG. 15A, a protective insulating film 76 is formed over the wiring layers 92a to 92c, the source and drain regions 88, the buffer layer 87, a microcrystalline semiconductor film 90 and the gate insulating film 52b. The protective insulating film 76 can be formed in a similar manner to the gate insulating films 52a and 52b.

Next, the protective insulating film 76 is partially etched using the mask pattern which is formed with the third photomask to form a contact hole. Next, the pixel electrode 77 which is in contact with the wiring layer 92c through the contact hole is formed. Here, in this example, an ITO film is formed to form the pixel electrode 77 by a sputtering method, and then a resist is applied to the ITO film. Subsequently, the resist is exposed to light and developed using a fourth photomask, thereby forming a mask pattern. Next, the ITO film is etched using the mask pattern to form the pixel electrode 77. Note that FIG. 15B corresponds to a cross-sectional view taken along a line A-B in FIG. 16C.

Through the above process, a thin film transistor and an element substrate including the thin film transistor that can be used for a display device can be formed.

Figure 17:
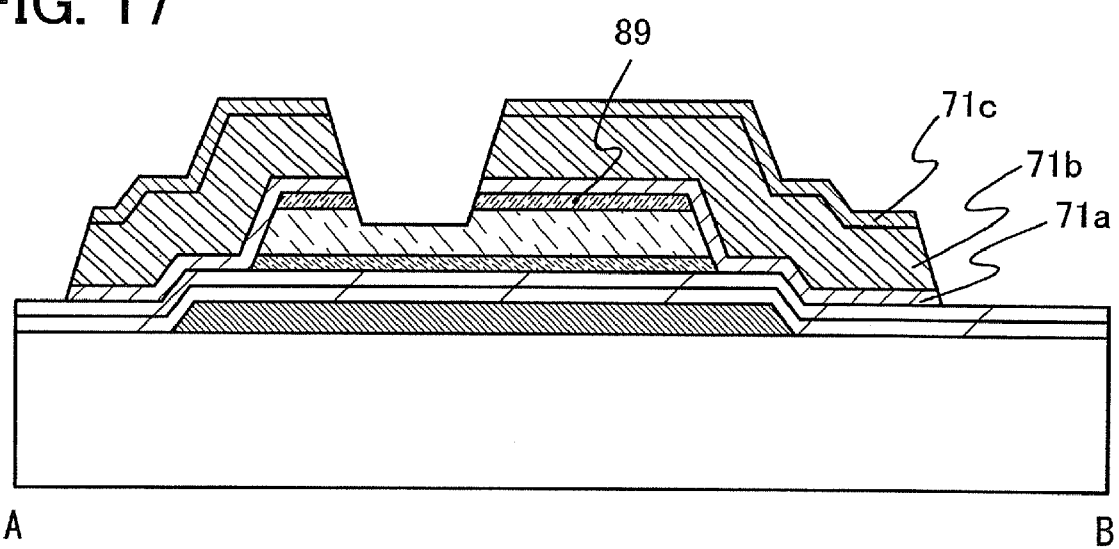
FIG. 17 is a cross-sectional view illustrating a display device of the present invention.

In FIGS. 9B or 14B, the wiring layers 71*a* to 71*c* or the wiring layers 92*a* to 92*c* are formed, respectively, and then the mask pattern 66 or the mask pattern 86 is removed, and the semiconductor films 63 to which an impurity element imparting one conductivity type is added may be etched using the wiring layers 71*a* to 71*c* or the wiring layers 92*a* to 92*c* as masks, respectively. As a result, a thin film transistor in which end portions of the wiring layers 71*a* to 71*c* or the wiring layers 92*a* to 92*c* are aligned with those of the source and drain regions 72 or the source and drain regions 88, respectively can be formed. Here, FIG. 17 illustrates a thin film transistor in which the mask pattern 66 illustrated in FIG. 9B is removed, and then the semiconductor film 63 to which an impurity element imparting one conductivity type is added is etched using the wiring layers 71*a* to 71*c* as a mask, so that end portions of source and drain regions 89 are aligned with the end portions of the wiring layers 71*a* to 71*c*.

Through the above-described process, a channel-etch thin film transistor can be formed. This channel-etch thin film transistor requires a smaller number of manufacturing steps and can achieve cost reduction. By formation of a channel formation region with a microcrystalline semiconductor film, a field-effect mobility of 1 cm$^2$/V·sec to 20 cm$^2$/V·sec can be achieved. Accordingly, this thin film transistor can be used as a switching element of a pixel in a pixel portion and as an element included in a scan line (gate line) side driver circuit.

Note that in this embodiment mode, a channel-etch thin film transistor is described; however, the microcrystalline semiconductor film can be used for a channel formation region of a channel protective thin film transistor.

This embodiment mode makes it possible to manufacture a thin film transistor which has excellent electric characteristics and high reliability and a display device including the thin film transistor.

Embodiment Mode 2

In this embodiment mode, as one mode of a display device, a liquid crystal display device including the thin film transistor described in Embodiment Mode 1 will be described below. Here, a vertical alignment (VA) liquid crystal display device will be described with reference to FIG. 18, FIG. 19 and FIG. 20. The VA liquid crystal display device is a kind of a method in which alignment of liquid crystal molecules of a liquid crystal panel is controlled. The VA liquid crystal display device is a mode in which liquid crystal molecules are vertical to a panel surface when voltage is not applied. In particular, in this embodiment mode, it is devised that a pixel is divided into several regions (sub-pixels) so that molecules are aligned in different directions in the respective regions. This is referred to as multi-domain or multi-domain design. In the following description, a liquid crystal display device with multi-domain design will be described.

Figure 18:
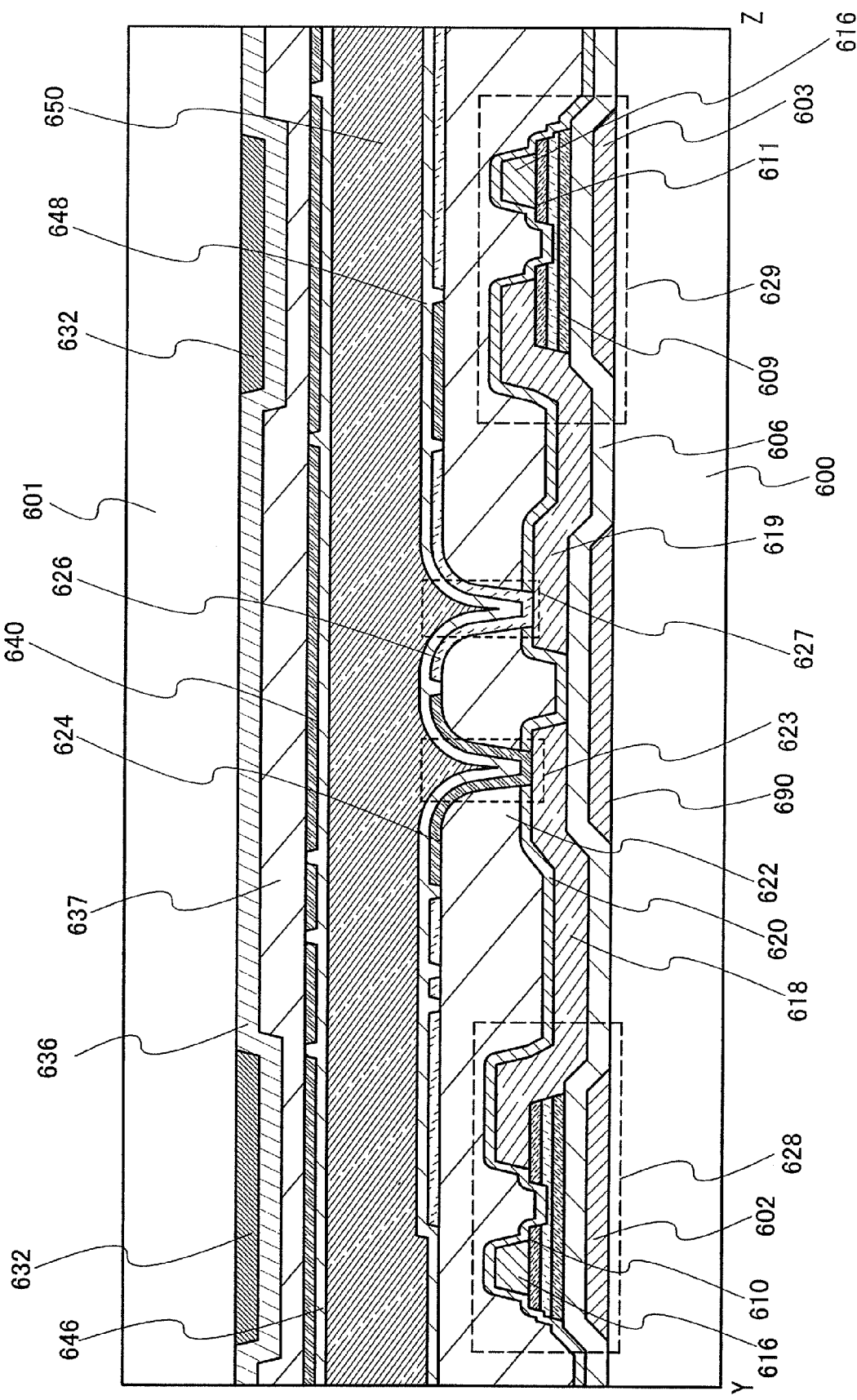
FIG. 18 is a cross-sectional view illustrating a display device of the present invention.
Figure 19:
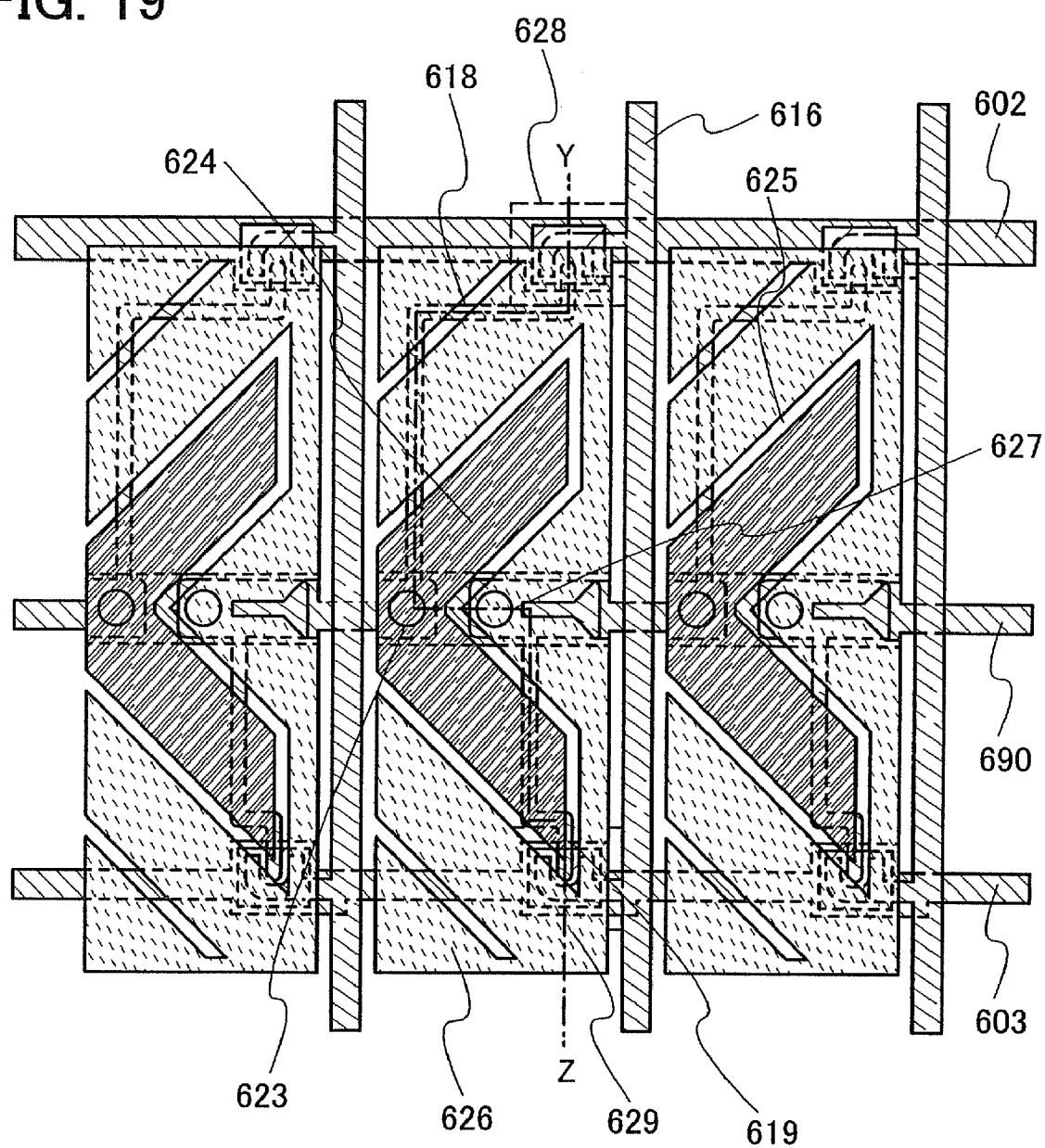
FIG. 19 is a top view illustrating the display device of the present invention.

FIGS. 18 and 19 each illustrate a pixel structure of the VA liquid crystal panel. FIG. 19 is a plan view of the substrate 600. FIG. 18 illustrates a cross-sectional structure along a line Y-Z in FIG. 19. Hereinafter, description will be made with reference to these drawings.

In this pixel structure, a plurality of pixel electrodes is included in one pixel, and a thin film transistor is connected to each pixel electrode with a planarization film 622 interposed therebetween. Each thin film transistor is driven by a different gate signal. That is, a multi-domain pixel has a structure in which signals supplied to the respective pixel electrodes are individually controlled.

Via the contact hole 623, the pixel electrode 624 is connected to a thin film transistor 628 through the wiring 618. Via a contact hole 627, the pixel electrode 626 is connected to a thin film transistor 629 through a wiring 619. The gate wiring 602 of the thin film transistor 628 and a gate wiring 603 of the thin film transistor 629 are separated so that different gate signals can be given. In contrast, a wiring 616 functioning as a data line is used in common for the thin film transistors 628 and 629. The thin film transistors 628 and 629 can be manufactured by the method described in Embodiment Mode 1. Note that numerals 610, 620, 690, 606, 609 and 611 denote one of a source region and a drain region of the thin film transistor 628, a protective insulating film, a capacitor wiring, a gate insulating film, a microcrystalline semiconductor film, and one of a source region and a drain region of the thin film transistor 629, respectively.

The pixel electrodes 624 and 626 have different shapes and are separated by the slit 625. The pixel electrode 626 is formed so as to surround the external side of the pixel electrode 624 which is spread in a V shape. Timing of voltage application is made to vary between the pixel electrodes 624 and 626 by the thin film transistors 628 and 629 in order to control alignment of the liquid crystal. When different gate signals are supplied to the gate wirings 602 and 603, operation timings of the thin film transistors 628 and 629 can vary. Further, an alignment film 648 is formed over the pixel electrodes 624 and 626.

Figure 20:
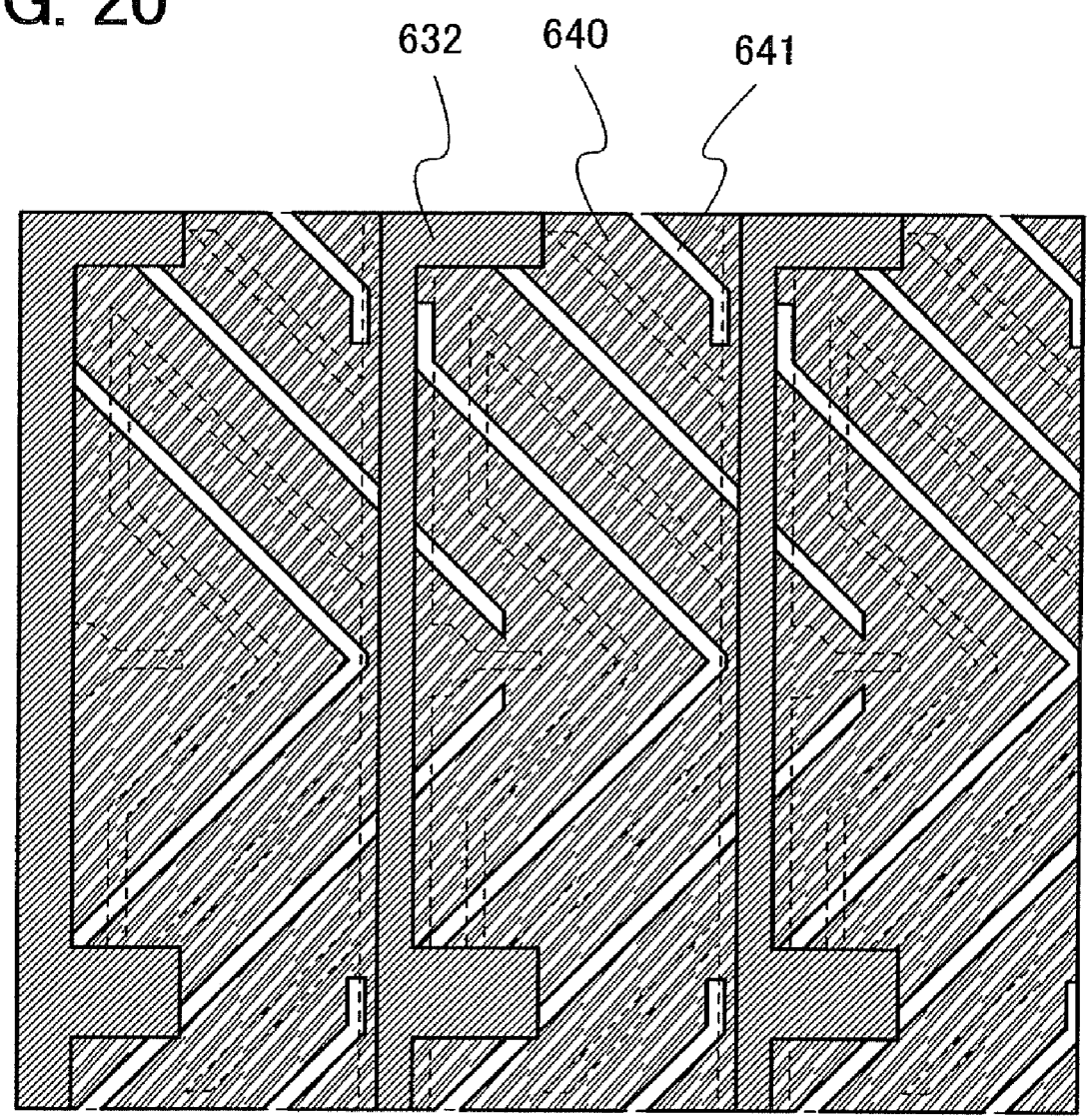
FIG. 20 is a top view illustrating the display device of the present invention.

The counter substrate 601 is provided with a light-shielding film 632, a color film 636, and a counter electrode 640. Moreover, a planarization film 637 is formed between the color film 636 and the counter electrode 640 to prevent alignment disorder of the liquid crystal. In addition, an alignment film 646 is provided for the counter electrode 640. FIG. 20 illustrates a structure of the counter substrate side. A slit 641 is formed in the counter electrode 640, which is used in common between different pixels. The slit 641 and the slit 625 between the pixel electrodes 624 and 626 are alternately arranged; thus, an oblique electric field is effectively generated, and alignment of the liquid crystal can be controlled. Accordingly, a direction in which the liquid crystal is aligned can vary depending on location, and a viewing angle is increased.

A first liquid crystal element is formed by overlapping of the pixel electrode 624, the liquid crystal layer 650, and the counter electrode 640. A second liquid crystal element is formed by overlapping of the pixel electrode 626, the liquid crystal layer 650, and the counter electrode 640. This is a multi-domain structure in which the first liquid crystal element and the second liquid crystal element are included in one pixel.

Note that here, a vertical alignment (VA) liquid crystal display device is described as a liquid crystal display device; however, the element substrate formed in Embodiment Mode 1 can be used for a FFS liquid crystal display device, an IPS liquid crystal display device, a TN liquid crystal display device and other liquid crystal display devices.

Through the above-described steps, the liquid crystal display device can be manufactured. Since a thin film transistor with small off current, excellent electric properties and high reliability is used in the liquid crystal display device of this embodiment mode, the liquid crystal display device with high contrast and high visibility can be manufactured.

Embodiment Mode 3

Figure 21A:
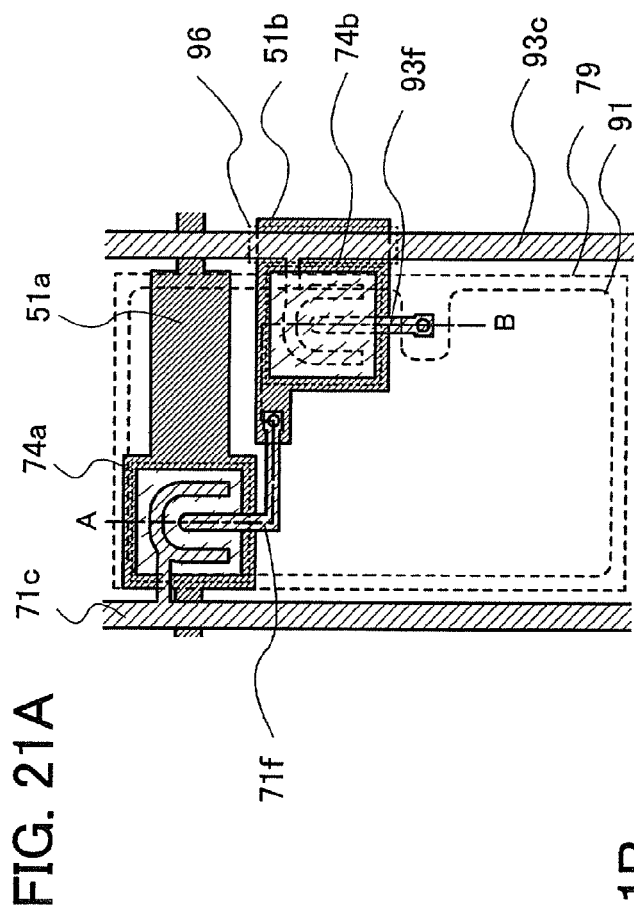
FIGS. 21A and 21B are a top view and a cross-sectional view, respectively, illustrating a display device of the present invention.
Figure 21B:
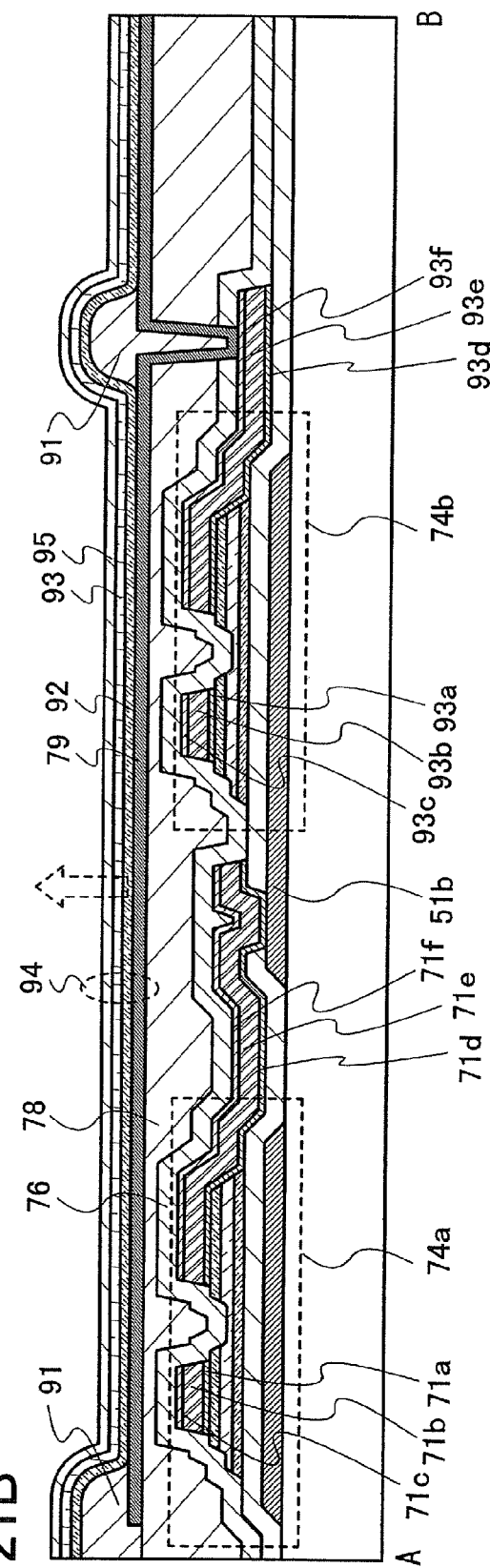

In this embodiment mode, as one mode of a display device, a light-emitting display device including a thin film transistor illustrated in Embodiment Mode 1 will be described hereinafter. Here, a structure of a pixel included in the light-emitting display device will be described. FIG. 21A illustrates one mode of a top view of the pixel, and FIG. 21B illustrates one mode of a cross-sectional structure of the pixel corresponding to a line A-B in FIG. 21A.

A light-emitting device, in which a light-emitting element utilizing electroluminescence is used, is described here. Light-emitting elements utilizing electroluminescence are classified according to whether a light-emitting material is an organic compound or an inorganic compound. In general, the former is referred to as organic EL elements and the latter as inorganic EL elements. Here, the process described in Embodiment Mode 1 can be used as a manufacturing process of the thin film transistor.

In an organic EL element, by application of a voltage to a light-emitting element, electrons and holes are separately injected from a pair of electrodes into a layer containing a light-emitting organic compound, and a current flows. Then, recombination of these carriers (the electrons and holes) causes the light-emitting organic compound to form an excited state and to emit light when it returns from the excited state to a ground state. Due to such a mechanism, such a light-emitting element is referred to as a current-excitation light-emitting element.

Inorganic EL elements are classified into a dispersion type inorganic EL element and a thin-film type inorganic EL element, depending on their element structures. A dispersion type inorganic EL element has a light-emitting layer where particles of a light-emitting material are dispersed in a binder, and its light emission mechanism is donor-acceptor recombination type light emission that utilizes a donor level and an acceptor level. A thin-film type inorganic EL element has a structure where a light-emitting layer is sandwiched between dielectric layers, which are further sandwiched between electrodes, and its light emission mechanism is localized type light emission that utilizes inner-shell electron transition of metal ions. Note that description will be made here using an organic EL element as a light-emitting element. In addition, description will be made using the channel-etch thin film transistor as a thin film transistor for switching which controls input of a signal to a pixel electrode and a thin film transistor which controls driving of a light-emitting element, but a channel-protective thin film transistor can also be used as appropriate.

In FIGS. 21A and 21B, a first thin film transistor 74a corresponds to a switching thin film transistor for controlling input of a signal to a pixel electrode, and a second thin film transistor 74b corresponds to a driving thin film transistor for controlling supply of current or voltage to a light-emitting element 94.

A gate electrode of the first thin film transistor 74a is connected to a scan line 51a, one of a source region and a drain region of the first thin film transistor 74a is connected to signal lines 71a to 71c, and the other of the source or the drain 71d to 71f is connected to a gate electrode 51b of the second thin film transistor 74b. One of a source or a drain of the second thin film transistor 74b is connected to power supply lines 93a to 93c, and the other of the source or the drain is connected to a pixel electrode of a display device. A capacitor 96 includes the gate electrode, the gate insulating film and the power supply lines 93a and 93c of the second thin film transistor 74b, and the other of the source or the drain of the second thin film transistor 74b is connected to the capacitor 96.

Note that the capacitor 96 corresponds to a capacitor for holding a voltage between the gate and the source or between the gate and the drain of the second thin film transistor 74b (hereinafter referred to as a gate voltage) when the first thin film transistor 74a is off, and is not necessarily provided.

In this embodiment mode, the first thin film transistor 74a and the second thin film transistor 74b can be formed by a method described in Embodiment Mode 1. Here, the first thin film transistor 74a and the second thin film transistor 74b are formed as n-channel thin film transistors; however, the first thin film transistor 74a may be formed as an n-channel thin film transistor and the second thin film transistor 74b may be formed as a p-channel thin film transistor. Alternatively, the first thin film transistor 74a and the second thin film transistor 74b may be formed as p-channel thin film transistors.

A protective insulating film 76 is formed over the first thin film transistor 74a and the second thin film transistor 74b, a planarization film 78 is formed over the protective insulating film 76, and a cathode 79 connected to a wiring 93c in contact holes formed in the planarization film 78 and the protective insulating film 76 is formed. The planarization film 78 is preferably formed using an organic resin such as acrylic, polyimide, or polyamide, or a siloxane polymer Since the cathode 79 has a concave portion in a contact hole, a partition wall 91 which covers a region of the concave portion and has openings is provided. A light-emitting layer 92 is formed so as to be in contact with the cathode 79 through the openings of the partition wall 91, an anode 93 is formed so as to cover the light-emitting layer 92, and a protective insulating film 95 is formed so as to cover the anode 93 and the partition wall 91.

Here, a light-emitting element 94 with a top emission structure will be described as a light-emitting element. The light-emitting element 94 with a top emission structure can emit light even in the case where it is over the first thin film transistor 74a or the second thin film transistor 74b; thus, a light emission area can be increased. However, if the base film of the light-emitting layer 92 is uneven, thickness distribution is nonuniform due to the unevenness and the anode 93 and the cathode 79 are short-circuited, and a display defect occurs. Therefore, a planarization film 78 is preferably provided.

A region in which the light-emitting layer 92 is interposed between the cathode 79 and the anode 93 corresponds to the light-emitting element 94. In the pixel illustrated in FIG. 21A, light emitted from the light-emitting element 94 is emitted to a side of the anode 93 as illustrated by a hollow arrow.

The cathode 79 can be formed using any known conductive material that has a low work function and reflects light. For example, Ca, Al, CaF, MgAg, AlLi, or the like is preferable. The light-emitting layer 92 may be formed using either a single layer or a plurality of stacked layers. In the case of using a plurality of layers, an electron injection layer, an electron transport layer, a light-emitting layer, a hole transport layer, and a hole injection layer are stacked in this order over the cathode 79. Note that not all of these layers are necessarily provided. The anode 93 is formed using a light-transmitting conductive material that transmits light, and for example, a light-transmitting conductive film of indium oxide containing tungsten oxide, indium zinc oxide containing tungsten oxide, indium oxide containing titanium oxide, indium tin oxide containing titanium oxide, ITO, indium zinc oxide, indium tin oxide to which silicon oxide is added, or the like may be used.

Here, a light-emitting element with a top emission structure in which light emission is extracted through a surface opposite a substrate side is described; however, a light-emitting element with a bottom emission structure in which light emission is extracted through a surface on the substrate side, or a light-emitting element with a dual emission structure in which light emission is extracted through the surface opposite the substrate side and the surface on the substrate side can be used as appropriate.

Although an organic EL element is described here as a light-emitting element, an inorganic EL element can also be provided as a light-emitting element.

Note that in this embodiment mode, the example is described in which a thin film transistor (a driving thin film transistor) which controls the driving of a light-emitting element is directly connected to the light-emitting element; however, a structure may be employed in which a current control thin film transistor is connected between the driving thin film transistor and the light-emitting element.

Through the above-described process, a light-emitting display device can be manufactured. Since a thin film transistor with small off current, excellent electric properties and high reliability is used in the light-emitting device of this embodiment mode, the light-emitting display device with high contrast and high visibility can be manufactured.

Embodiment Mode 4

Next, a structure of a display panel, which is one mode of a display device of the present invention, will be described below.

Figure 22A:
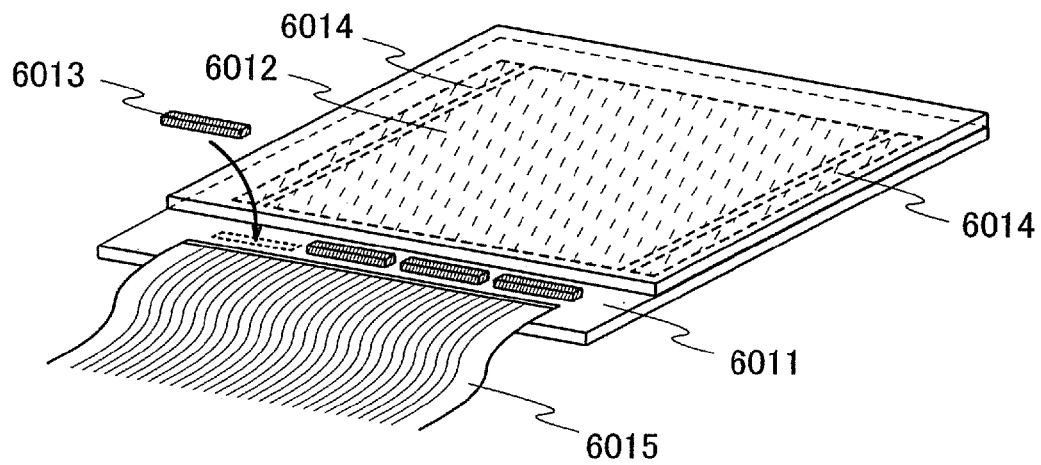
FIGS. 22A to 22C are perspective views each illustrating a display panel of the present invention.

FIG. 22A illustrates a mode of a display panel in which a signal line driver circuit 6013 which is separately formed is connected to a pixel portion 6012 formed over a substrate 6011. The pixel portion 6012 and a scan line driver circuit 6014 are each formed using a thin film transistor in which a microcrystalline semiconductor film is used for a channel formation region. When the signal line driver circuit is formed using a transistor which has higher mobility compared with the thin film transistor in which the microcrystalline semiconductor film is used for the channel formation region, an operation of the signal line driver circuit which demands higher driving frequency than that of the scan line driver circuit can be stabilized. Note that the signal line driver circuit 6013 may be formed using a transistor in which a single crystalline semiconductor is used for a channel formation region, a thin film transistor in which a polycrystalline semiconductor is used for a channel formation region, or a transistor in which SOI is used for a channel formation region. The pixel portion 6012, the signal line driver circuit 6013, and the scan line driver circuit 6014 are each supplied with a potential of a power supply, a variety of signals, and the like via an FPC 6015.

Note that both the signal line driver circuit and the scan line driver circuit may be formed over the same substrate as the pixel portion.

Figure 22B:
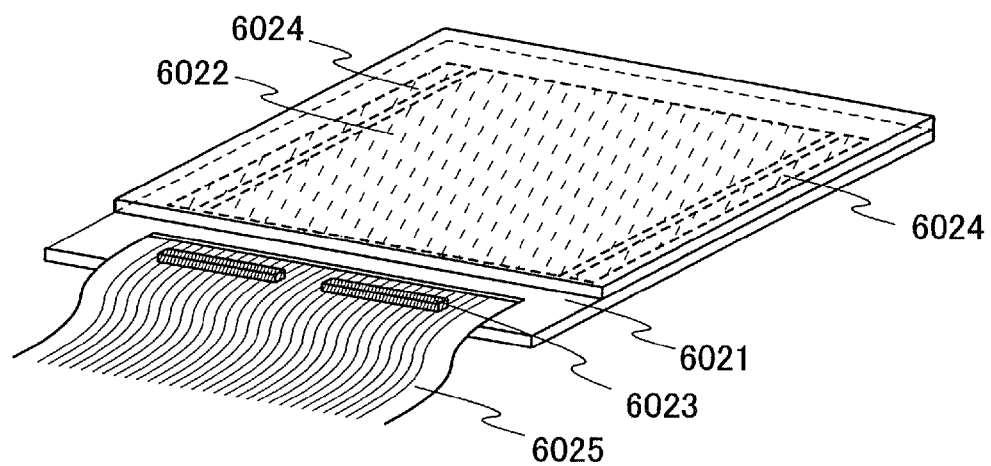

When a driver circuit is separately formed, a substrate over which the driver circuit is formed is not necessarily attached to a substrate over which a pixel portion is formed, and may be attached over an FPC, for example. FIG. 22B illustrates a mode of a display device panel in which a signal line driver circuit 6023 is separately formed and is connected to a pixel portion 6022 and a scan line driver circuit 6024 which are formed over a substrate 6021. The pixel portion 6022 and the scan line driver circuit 6024 are each formed using a thin film transistor in which a microcrystalline semiconductor film is used for a channel formation region. The signal line driver circuit 6023 is connected to the pixel portion 6022 via an FPC 6025. The pixel portion 6022, the signal line driver circuit 6023, and the scan line driver circuit 6024 are each supplied with a potential of a power supply, a variety of signals, and the like via the FPC 6025.

Figure 22C:
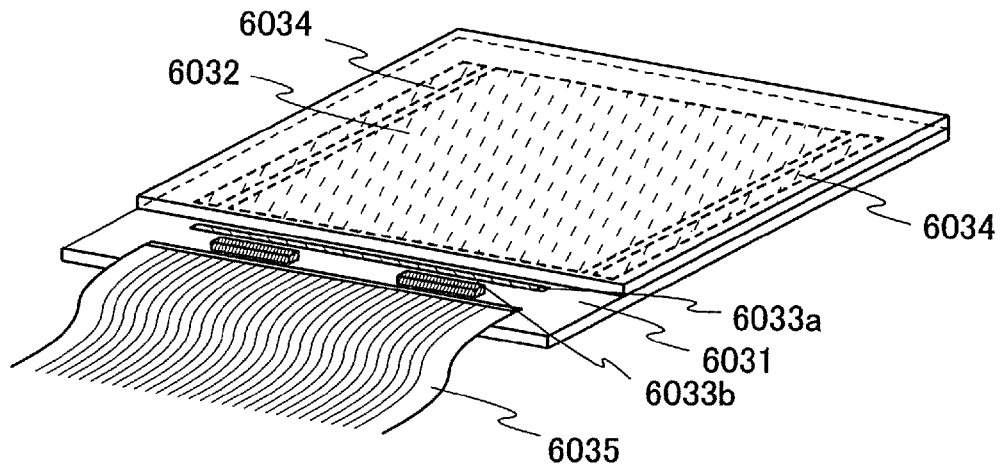

Alternatively, only part of a signal line driver circuit or part of a scan line driver circuit may be formed over the same substrate as a pixel portion by using a thin film transistor in which a microcrystalline semiconductor film is used for a channel formation region, and the other part of the driver circuit may be separately formed and electrically connected to the pixel portion. FIG. 22C illustrates a mode of a panel of a display device in which an analog switch 6033a included in a signal line driver circuit is formed over a substrate 6031, over which a pixel portion 6032 and a scan line driver circuit 6034 are formed, and a shift register 6033b included in the signal line driver circuit is separately formed over a different substrate and attached to the substrate 6031. The pixel portion 6032 and the scan line driver circuit 6034 are each formed using a thin film transistor in which a microcrystalline semiconductor film is used for a channel formation region. The shift register 6033b included in the signal line driver circuit is connected to the pixel portion 6032 via an FPC 6035. The pixel portion 6032, the signal line driver circuit, and the scan line driver circuit 6034 are each supplied with a potential of a power supply, a variety of signals, and the like via the FPC 6035.

As illustrated in FIGS. 22A to 22C, in display devices of this embodiment mode, all or a part of the driver circuit can be formed over the same substrate as the pixel portion, using the thin film transistor in which the microcrystalline semiconductor film is used for the channel formation region.

Note that a connection method of a substrate which is separately formed is not particularly limited, and a known COG method, wire bonding method, TAB method, or the like can be used. Further, a connection position is not limited to the positions illustrated in FIGS. 22A to 22C as long as electrical connection is possible. Moreover, a controller, a CPU, a memory, or the like may be formed separately and connected.

Note that a signal line driver circuit used in the present invention includes a shift register and an analog switch. In addition to the shift register and the analog switch, another circuit such as a buffer, a level shifter, or a source follower may be included. Moreover, the shift register and the analog switch are not necessarily provided. For example, a different circuit such as a decoder circuit by which a signal line can be selected may be used instead of the shift register, or a latch or the like may be used instead of the analog switch.

Embodiment Mode 5

The display device or the like obtained according to the present invention can be used for an active matrix display device panel. That is, the present invention can be implemented in any electronic device having a display portion in which such a display device is incorporated.

Examples of such electronic devices include cameras such as a video camera and a digital camera, a head-mounted display (a goggle-type display), a car navigation system, a projector, a car stereo, a personal computer, and a portable information terminal (e.g., a mobile computer, a cellular phone, and an e-book reader). FIGS. 23A to 23D illustrate examples of such electronic devices.

Figure 23A:
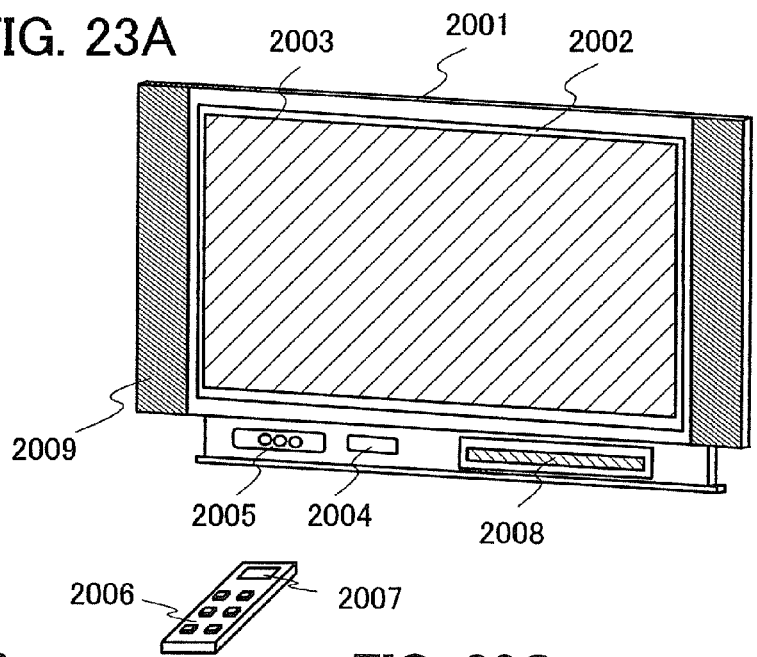
FIGS. 23A to 23D are perspective views each illustrating an electronic device using a display device of the present invention.

FIG. 23A illustrates a television device. The television device can be completed by incorporating a display panel into a housing as illustrated in FIG. 23A. A main screen 2003 is formed using the display panel, and other accessories such as a speaker portion 2009 and an operation switch are provided. Thus, the television device can be completed.

As illustrated in FIG. 23A, a display panel 2002 using a display element is incorporated into a housing 2001. The television device can receive general TV broadcast by a receiver 2005, and can be connected to a wired or wireless communication network via a modem 2004 so that one-way (from a sender to a receiver) or two-way (between a sender and a receiver or between receivers) information communication can be performed. The television device can be operated by a switch incorporated into the housing or a separate remote control unit 2006. The remote control unit may include a display portion 2007 for displaying information to be output.

Further, the television device may include a sub screen 2008 formed using a second display panel for displaying channels, sound volume, and the like, in addition to the main screen 2003. In this structure, the main screen 2003 may be formed using a liquid crystal display panel, and the sub screen may be formed using a light-emitting display panel. Alternatively, a structure may be employed in which the main screen 2003 is formed using a light-emitting display panel, the sub screen is formed using a light-emitting display panel, and the sub screen can be turned on and off.

Figure 24:
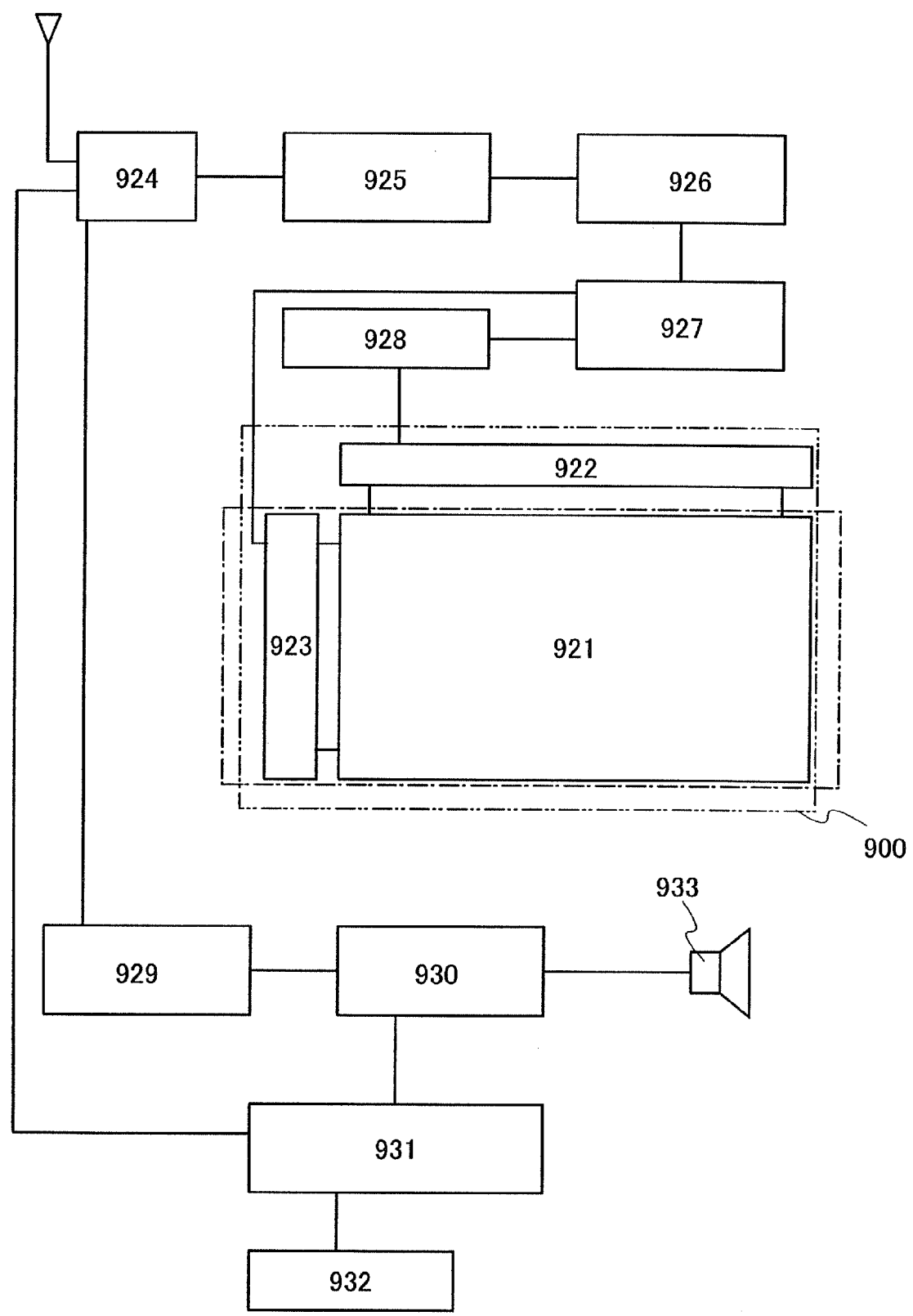
FIG. 24 is a diagram illustrating an electronic device using a display device of the present invention.

FIG. 24 is a block diagram of a main structure of a television device. A display panel 900 is provided with a pixel portion 921. A signal line driver circuit 922 and a scan line driver circuit 923 may be mounted on the display panel 900 by a COG method.

As for other external circuits, the television device includes a video signal amplifier circuit 925 which amplifies a video signal among signals received by a tuner 924; a video signal processing circuit 926 which converts a signal output from the video signal amplifier circuit 925 into a color signal corresponding to each color of red, green, and blue; a control circuit 927 which converts the video signal into an input specification of a driver IC; and the like. The control circuit 927 outputs signals to each of the scan line side and the signal line side. When digital driving is performed, a structure may be employed in which a signal dividing circuit 928 is provided on the signal line side and an input digital signal is divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and sound volume from an input portion 932 and transmits a signal to the tuner 924 and the audio signal processing circuit 930.

Needless to say, the present invention is not limited to a television device and can be applied to a variety of uses, such as a monitor of a personal computer, a large display medium such as an information display board at a train station, an airport, or the like, or an advertisement display board on a street.

A display device described in the embodiment mode is applied to the main screen 2003 and the sub screen 2008, whereby mass productivity of television devices can be increased.

Figure 23B:
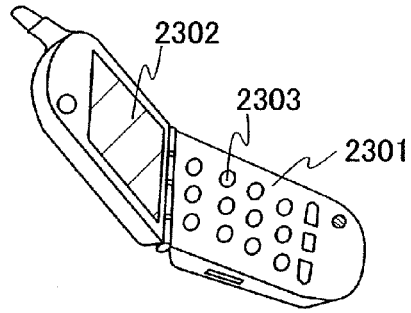

FIG. 23B illustrates an example of a cellular phone 2301. The cellular phone 2301 includes a display portion 2302, an operation portion 2303, and the like. When the display device described in the above-described embodiment mode is used for the display portion 2302, mass productivity of the cellular phone can be increased.

Figure 23C:
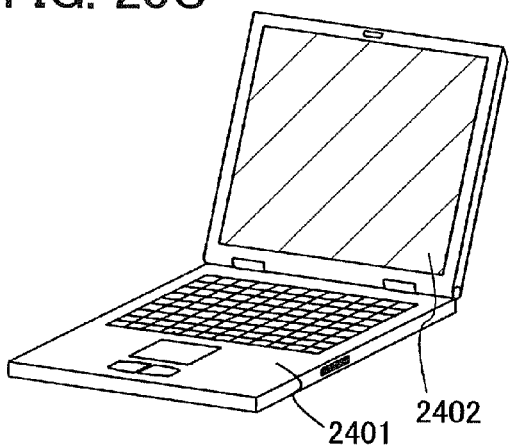

A portable computer illustrated in FIG. 23C includes a main body 2401, a display portion 2402, and the like. When the display device described in the above-described embodiment mode is used for the display portion 2402, mass productivity of the computers can be increased.

Figure 23D:
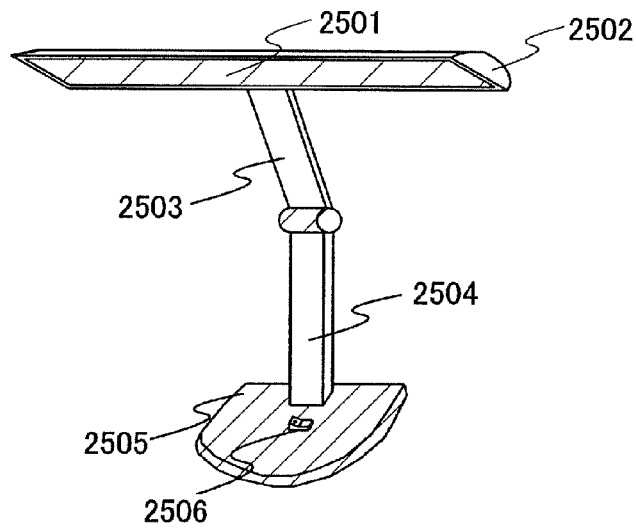

FIG. 23D illustrates a desk lamp including a lighting portion 2501, a shade 2502, an adjustable arm 2503, a support 2504, a base 2505, and a power supply switch 2506. The desk lamp is formed using the light-emitting device of the present invention, for the lighting portion 2501. Note that a lamp includes a ceiling light, a wall light, and the like in its category. When the display device described in the above-described embodiment mode is used, mass productivity can be increased, so that an inexpensive desk lamp can be provided.

This application is based on Japanese Patent Application serial No. 2007-240201 filed with Japan Patent Office on Sep. 14, 2007, the entire contents of which are hereby incorporated by reference.

What is claimed is:

1. A method for manufacturing a thin film transistor, comprising the steps of:
   forming a gate electrode over a substrate;
   forming a gate insulating film over the substrate and the gate electrode;
   forming crystal nuclei over the gate insulating film using fluorosilane and silane;
   forming a microcrystalline semiconductor film by generating crystal growth using the crystal nuclei as nuclei;
   forming a buffer layer over the microcrystalline semiconductor film;
   forming a source region and a drain region which are formed using a semiconductor film to which an impurity element imparting one conductivity type is added over the buffer layer; and
   forming a source electrode and a drain electrode over the source region and the drain region.

2. The method for manufacturing the thin film transistor according to claim 1,
   wherein the crystal nuclei are formed by glow discharge plasma.

3. The method for manufacturing the thin film transistor according to claim 1,
   wherein the method further comprises a step of forming a pixel electrode which is in contact with the source electrode or the drain electrode of the thin film transistor.

4. A display device comprising the thin film transistor manufactured by the method according to claim 1 in a pixel portion.

5. The method for manufacturing the thin film transistor according to claim 1,
   wherein the microcrystalline semiconductor film is formed by a plasma CVD apparatus.

6. The method for manufacturing the thin film transistor according to claim 1,
   wherein the crystal nuclei and the microcrystalline semiconductor film are formed by a plasma CVD apparatus successively.

7. The method for manufacturing the thin film transistor according to claim 1,
   wherein the buffer layer is formed by an amorphous semiconductor film.

8. A method for manufacturing a thin film transistor, comprising the steps of:
   forming a gate electrode over a substrate;
   forming a gate insulating film over the substrate and the gate electrode;
   forming crystal nuclei over the gate insulating film using fluorosilane and silane;
   forming a microcrystalline semiconductor film by generating crystal growth using the crystal nuclei as nuclei, and then successively forming a buffer layer over the microcrystalline semiconductor film;

forming a source region and a drain region which are formed using a semiconductor film to which an impurity element imparting one conductivity type is added over the buffer layer; and forming a source electrode and a drain electrode over the source region and the drain region.

9. The method for manufacturing the thin film transistor according to claim 8, wherein the crystal nuclei are formed by glow discharge plasma.

10. The method for manufacturing the thin film transistor according to claim 8, wherein the method further comprises a step of forming a pixel electrode which is in contact with the source electrode or the drain electrode of the thin film transistor.

11. A display device comprising the thin film transistor manufactured by the method according to claim 8 in a pixel portion.

12. The method for manufacturing the thin film transistor according to claim 8, wherein the microcrystalline semiconductor film is formed by a plasma CVD apparatus.

13. The method for manufacturing the thin film transistor according to claim 8, wherein the crystal nuclei and the microcrystalline semiconductor film are formed by a plasma CVD apparatus successively.

14. The method for manufacturing the thin film transistor according to claim 8, wherein the buffer layer is formed by an amorphous semiconductor film.

15. A method for manufacturing a thin film transistor, comprising the steps of:

forming a gate electrode over a substrate;

forming a gate insulating film over the substrate and the gate electrode;

performing a plasma treatment on a surface of the gate insulating film;

forming crystal nuclei over the gate insulating film using fluorosilane and silane;

forming a microcrystalline semiconductor film by generating crystal growth using the crystal nuclei as nuclei;

forming a buffer layer over the microcrystalline semiconductor film;

forming a source region and a drain region which are formed using a semiconductor film to which an impurity element imparting one conductivity type is added over the buffer layer; and forming a source electrode and a drain electrode over the source region and the drain region.

16. The method for manufacturing the thin film transistor according to claim 15, wherein the crystal nuclei are formed by glow discharge plasma.

17. The method for manufacturing the thin film transistor according to claim 15, wherein the method further comprises a step of forming a pixel electrode which is in contact with the source electrode or the drain electrode of the thin film transistor.

18. The method for manufacturing the thin film transistor according to claim 15, wherein the plasma treatment uses fluorosilane and hydrogen.

19. A display device comprising the thin film transistor manufactured by the method according to claim 15 in a pixel portion.

20. The method for manufacturing the thin film transistor according to claim 15, wherein the microcrystalline semiconductor film is formed by a plasma CVD apparatus.

21. The method for manufacturing the thin film transistor according to claim 15, wherein the crystal nuclei and the microcrystalline semiconductor film are formed by a plasma CVD apparatus successively.

22. The method for manufacturing the thin film transistor according to claim 15, wherein the buffer layer is formed by an amorphous semiconductor film.

23. A method for manufacturing a thin film transistor, comprising the steps of:

forming a gate electrode over a substrate;

forming a gate insulating film over the substrate and the gate electrode;

performing a plasma treatment on a surface of the gate insulating film;

forming crystal nuclei over the gate insulating film using fluorosilane and silane;

forming a microcrystalline semiconductor film by generating crystal growth using the crystal nuclei as nuclei, and then successively forming a buffer layer over the microcrystalline semiconductor film;

forming a source region and a drain region which are formed using a semiconductor film to which an impurity element imparting one conductivity type is added over the buffer layer; and forming a source electrode and a drain electrode over the source region and the drain region.

24. The method for manufacturing the thin film transistor according to claim 23, wherein the crystal nuclei are formed by glow discharge plasma.

25. The method for manufacturing the thin film transistor according to claim 23, wherein the method further comprises a step of forming a pixel electrode which is in contact with the source electrode or the drain electrode of the thin film transistor.

26. The method for manufacturing the thin film transistor according to claim 23, wherein the plasma treatment uses fluorosilane and hydrogen.

27. A display device comprising the thin film transistor manufactured by the method according to claim 23 in a pixel portion.

28. The method for manufacturing the thin film transistor according to claim 23, wherein the microcrystalline semiconductor film is formed by a plasma CVD apparatus.

29. The method for manufacturing the thin film transistor according to claim 23, wherein the crystal nuclei and the microcrystalline semiconductor film are formed by a plasma CVD apparatus successively.

30. The method for manufacturing the thin film transistor according to claim 23, wherein the buffer layer is formed by an amorphous semiconductor film.

* * * * *